United States Patent
Meller et al.

(10) Patent No.: US 8,341,113 B2
(45) Date of Patent: Dec. 25, 2012

(54) METHOD AND SYSTEM FOR UPDATING VERSIONS OF CONTENT STORED IN A STORAGE DEVICE

(75) Inventors: Evyatar Meller, Yad Binyamin (IL); Sharon Peleg, Ramat Hasharon (IL)

(73) Assignee: Red Bend Ltd., Rosh Haayin (IL)

( * ) Notice: Subject to any disclaimer, the term of this patent is extended or adjusted under 35 U.S.C. 154(b) by 0 days.

(21) Appl. No.: 12/947,322

(22) Filed: Nov. 16, 2010

(65) Prior Publication Data

US 2011/0093841 A1    Apr. 21, 2011

Related U.S. Application Data

(62) Division of application No. 10/873,173, filed on Jun. 23, 2004, now Pat. No. 7,860,834.

(60) Provisional application No. 60/480,225, filed on Jun. 23, 2003, provisional application No. 60/546,163, filed on Feb. 23, 2004.

(51) Int. Cl.
*G06F 17/30* (2006.01)

(52) U.S. Cl. ........ 707/609; 707/608; 717/168; 717/169; 717/170; 717/172

(58) Field of Classification Search ................... 707/609, 707/638; 717/168, 169, 170, 172
See application file for complete search history.

(56) References Cited

U.S. PATENT DOCUMENTS

| 5,752,039 A | 5/1998 | Tanimura |
| 5,832,520 A | 11/1998 | Miller |
| 6,546,552 B1 | 4/2003 | Peleg |
| 6,748,584 B1 | 6/2004 | Witchel et al. |
| 6,925,467 B2 | 8/2005 | Gu et al. |
| 2004/0260734 A1 * | 12/2004 | Ren et al. ...................... 707/203 |

FOREIGN PATENT DOCUMENTS

EP    0752794 A2    1/1997

OTHER PUBLICATIONS

Hunt, J.J. et al., An Empirical Study of Delta Algorithms, Software Configuration Management. ICSE SCM Workshop, pp. 49-66, 1996.
Baker, B.S. et al., Compressing Differences of Executable Code, WCSSS 99 ACM Sigplan Workshop on Compiler Support for System Software Inst., pp. 1-10, 1999.

* cited by examiner

*Primary Examiner* — Hung Q Pham
(74) *Attorney, Agent, or Firm* — Buchanan Ingersoll & Rooney PC

(57) ABSTRACT

A system for generating a compact update package between an old version of content and a new version of content. The system includes a conversion element generator for generating a conversion element associated with the old version and new version. A modified version generator for generating a modified version including applying the conversion element to the old versions. An update package generator for generating the compact update package. The compact update package includes the conversion element and a modified delta based on the modified version and the new version.

18 Claims, 13 Drawing Sheets

```
                                            ┌─1201
905': start = addr (905)
     length=size (905) +size (909)
     shift = 0
906': start = addr (906) + size (909)
     length = size (906)
     shift = size (909)
908': start = addr (908) + size (909)+ size (910)
     length = size (908)
     shift = size (909) + size (910)
```

```
                                            ┌─1202
1203─ modify < addr (905), size (905)+ size (909)>, 0
1204─ modify < addr (906)+ size (909), size(906) >, size(909)
1205─ modify < addr (908) + size (909) + size(910),
              size(908)>, size(909) + size(910)
```

METHOD AND SYSTEM FOR UPDATING VERSIONS OF CONTENT STORED IN A STORAGE DEVICE

FIELD OF THE INVENTION

This invention relates to creating compact updating versions of content stored in a storage device.

BACKGROUND OF THE INVENTION

U.S. Pat. No. 6,546,552 discloses a method for generating a compact difference result between an old program and a new program. Each program including reference entries that contain reference that refers to other entries in the program. The method includes the steps of scanning the old program and for each reference entry perform steps that include replacing the reference of the entry by a distinct label mark, whereby a modified old program is generated. There is further provided the step of scanning the new program and for each reference entry perform steps that include replacing the reference of the entry by a distinct label mark, whereby a modified new program is generated. There is still further provided the step of generating the specified difference result utilizing directly or indirectly the modified old program and modified new program.

There is a need in the art to provide for a new method and system for updating versions of content stored in a storage device.

SUMMARY OF THE INVENTION

The present invention provides A method for generating a compact update package between an old version of content and a new version of content, comprising:
(i) generating a conversion element associated with said old version and new version;
(ii) generating a modified version including applying the conversion element to one of said versions;
(iii) generating said compact update package; the compact update package includes said conversion element and a modified delta based on at least said modified version and the version other than said one version stipulated in (ii).

The present invention further provides a method for updating an old version of content giving rise to a new version of content, comprising:
(i) obtaining a compact update package; said compact update package includes: a conversion element associated with said old version and new version, modified delta, and indication of forward update or backward update;
(ii) in the case of forward update indication
  a. generating a modified version including applying the conversion element to said old version; and
  b. generating said new version including applying said modified delta to said modified version.
(iii) in the case of backward update indication
  a. generating a modified version including applying the modified delta to said old version; and
generating said new version including applying said conversion element to the modified version stipulated in (iii)(a).

Yet still further the invention provides a method generating an update package for allowing updating versions of content stored in a storage device, the update package allows updating an old version of said content to a new version thereof, the method comprising:
determining values indicative of addresses of referenced items in reference items of said old version;
determining modification shifts for referenced items in said old version; and
setting integer shift rules for allowing modification of said reference item in accordance with said modification shifts.

The invention still further provides a program storage device readable by machine, tangibly embodying a program of instructions executable by the machine to perform method steps for generating a compact update package between an old version of content and a new version of content, comprising:
(i) generating a conversion element associated with said old version and new version;
(ii) generating a modified version including applying the conversion element to one of said versions;
(iii) generating said compact update package; the compact update package includes said conversion element and a modified delta based on at least said modified version and the version other than said one version stipulated in (ii).

Yet still further the invention provides a program storage device readable by machine, tangibly embodying a program of instructions executable by the machine to perform method steps for updating an old version of content giving rise to a new version of content, comprising:
(i) obtaining a compact update package; said compact update package includes: a conversion element associated with said old version and new version, modified delta, and indication of forward update or backward update;
(ii) in the case of forward update indication
  a) generating a modified version including applying the conversion element to said old version; and
  b) generating said new version including applying said modified delta to said modified version.
(iii) in the case of backward update indication
  a) generating a modified version including applying the modified delta to said old version; and
  b) generating said new version including applying said conversion element to the modified version stipulated in (iii)(a).

By another aspect the invention provides a system for generating a compact update package between an old version of content and a new version of content, comprising:
a conversion element generator for generating a conversion element associated with said old version and new version;
a modified version generator for generating a modified version including applying the conversion element to one of said versions;
an update package generator for generating said compact update package; the compact update package includes said conversion element and a modified delta based on at least said modified version and the version other than said one version.

Yet still further the invention provides a system for updating an old version of content giving rise to a new version of content, comprising:
an input module configured to obtaining a compact update package; said compact update package includes: a conversion element associated with said old version and new version, modified delta, and indication of forward update or backward update;
processor configured to perform:
  in the case of forward update indication
  a) generating a modified version including applying the conversion element to said old version; and b) generating said new version including applying said modified delta to said modified version, or
in the case of backward update indication
a) generating a modified version including applying the modified delta to said old version; and
b) generating said new version including applying said conversion element to the modified version stipulated in (iii)(a).

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF EXEMPLARY EMBODIMENTS

Figure 1:
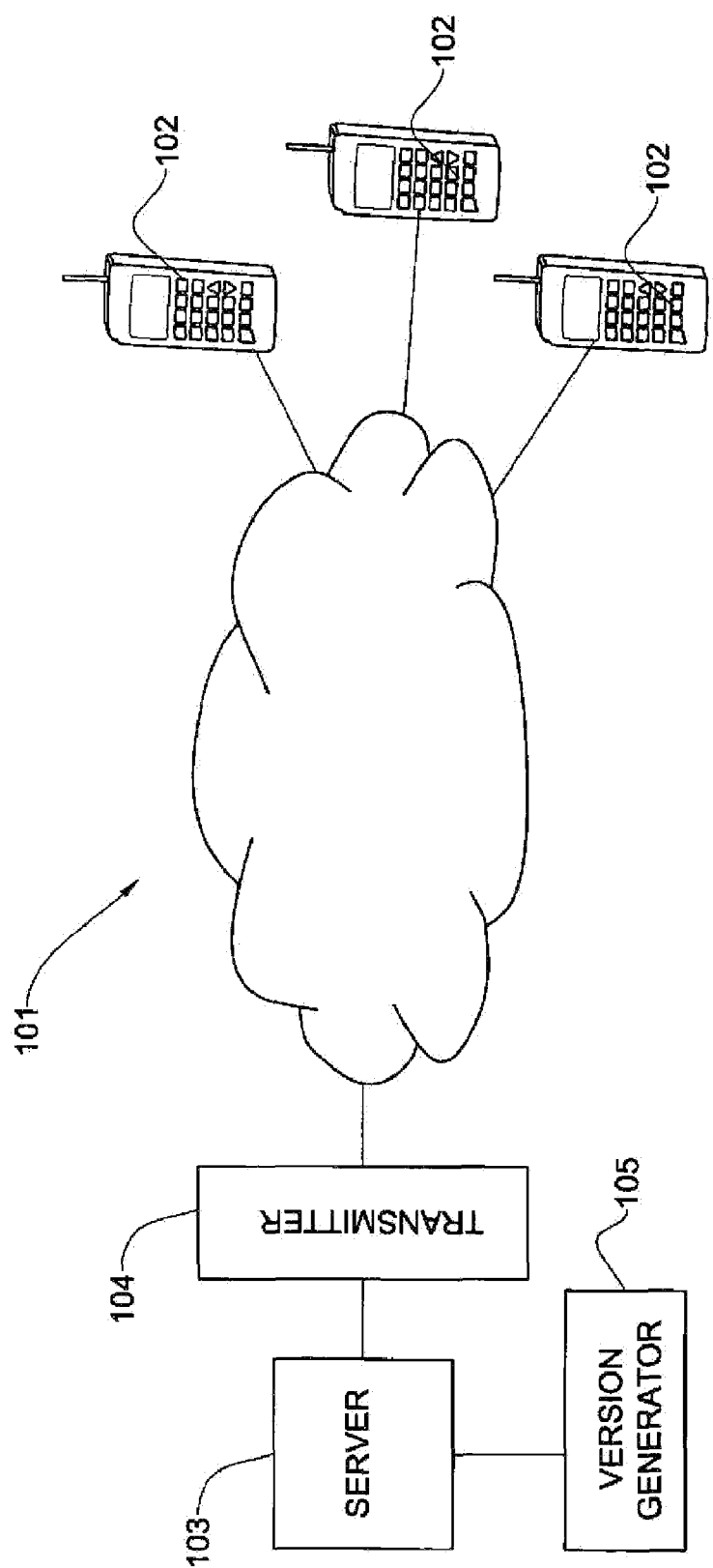
FIG. 1 is a schematic illustration of a system providing update of versions in a cellular network, in accordance with one embodiment of the invention.

FIG. 1 is a schematic illustration of a system 101 providing update of versions in a cellular network, in accordance with one embodiment of the invention. Cellular telephones 102 that are coupled to memory devices, execute programs that enable their operation. The version of the program currently executing on the cellular telephones is referred to, hereinafter, as old version. Sometimes there is a need to update the programs in order for the telephones 102 to execute a new version thereof. The new version is generated on a version generator 105, such as a personal computer (PC). The new version is stored on a server 103 and transmitted, via a transmitter 104 to the cellular telephones 102.

It should be noted that the system 101 illustrated in FIG. 1 is a non-binding example and the invention is not limited to cellular networks or to update of programs. Many other types of content require update, such as data stored in storage devices. For example, a Personal Compute (PC), or any other computer, can store files including data required for its operation or for operation of programs executing thereon (such as "info files" known for those versed in the art). Sometimes it is required to update this data via communications lines, for example, via the internet.

Therefore, hereinafter the term "content" will be used instead of "program". In the same way, the term "storage device" will be used instead of the cellular telephones' memory devices in FIG. 1.

In order to update content stored in the storage devices, update packages are generated and stored in the server and transmitted to the storage devices or to other devices coupled therewith.

It should be noted that a storage device can be associated with an embedded device. The embedded device can, for example, be a member in a group that includes, e.g., cellular telephones and/or consumer electronic devices. Alternatively, the storage device can be associated with a computer.

Figure 2:
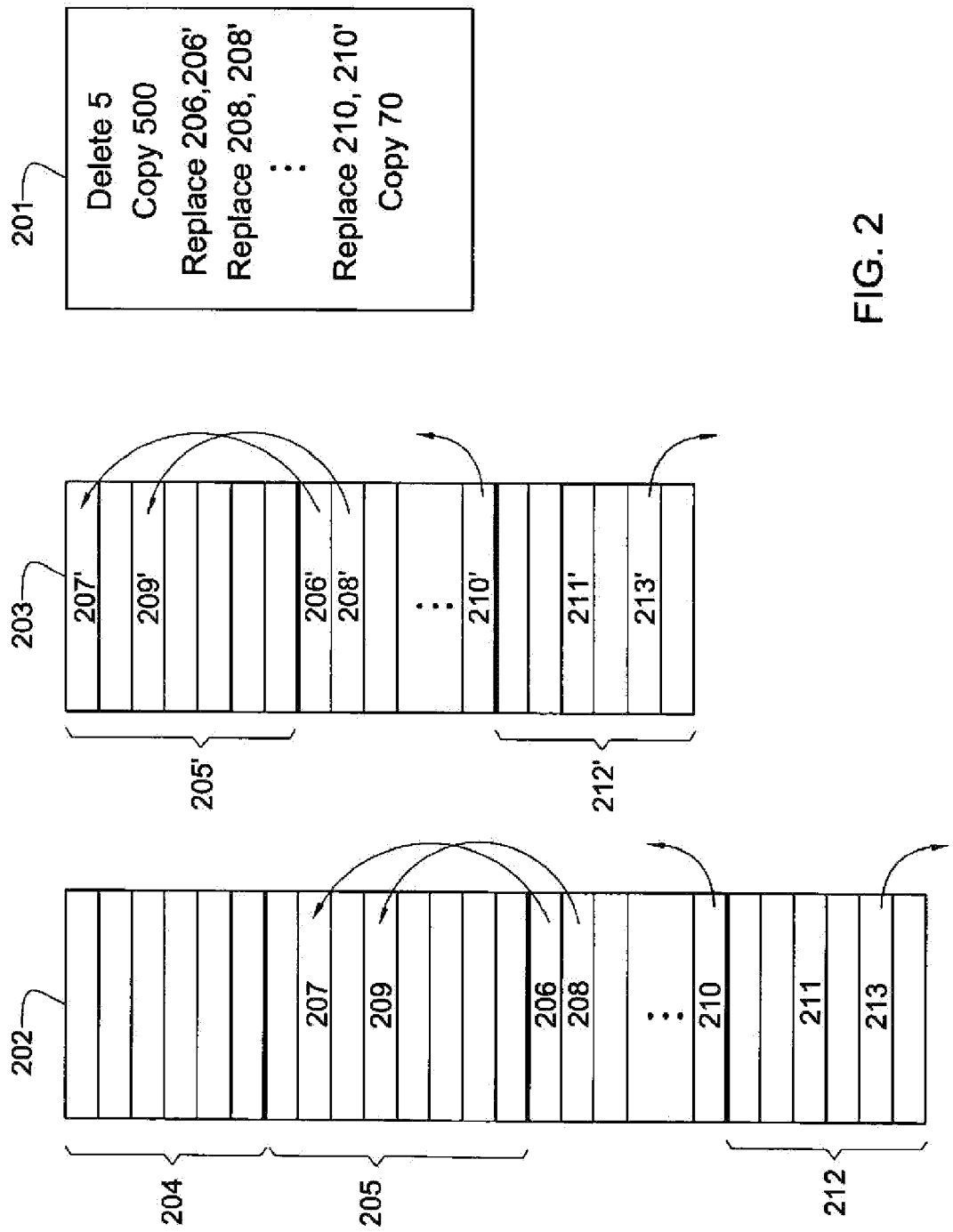
FIG. 2 is a schematic illustration of an update package adapted to update an old version of content into a new version.

FIG. 2 is a schematic illustration of an update package 201 adapted to update an old version of content 202 into a new version 203. An old version of content (such as old version 202) is also referred to, shortly, as "old version". Likewise, a new version of content (such as the new version 203) is referred to, shortly, as "new version".

It is noted that the update package 201 can be generated in accordance with methods known per se to those versed in the art. Similarly, the ways to apply this update package in order to update the old version 202 to the new version 203 are also known.

It should also be noted that an update package is sometimes referred to as "delta file", "difference file" or shortly as "delta" or "difference", wherein the delta is a collections of modifications occurring while updating an old version to a new version. Thus, a person versed in the art can appreciated that an update package can be a delta file or alternatively, it can include a delta file and perhaps additional information.

The old version 202 includes a block 204 of five items, each item can be the size of at least one word, the size of one or more bytes, or any other applicable measurement. The block 204 is followed by a second block 205 of, e.g., five hundred items. Next, the old version 202 includes an item 206 that includes at least a reference (such as a pointer) to a certain item 207 in the second block 205. Items including at least one reference are referred to, hereinafter, as "reference items". For example, a reference item 206 can include an instruction associated with an absolute reference to 207, such as "jump to the absolute address of item 207".

It should be appreciated that if the content represented by the old and new versions (such as 202 and 203) is a computer program, for example, a block can represent a program function, as known to those versed in the art.

Reference item 206 is followed by another reference item 208, including a reference to a different item 209 in the second block 205. The reference item 208 is followed by other reference items, all include references to items within the second block 205, the last of them is reference item 210. Whilst not shown in the figure, according to the example there are, e.g. one hundred reference items between reference item 206 and reference item 210.

It is appreciated that the old version 202 can include also non-reference items, i.e., items that include no reference. The item 211 is an example to a non-reference item. Unless specifically noted, the term "item" refers, hereinafter, both to reference and non-reference items.

In addition, the old version 202 can include reference items to other items that are not included in the old version 202, i.e., references to items being external to the content. For example, if the old version represents a computer program that is loaded to a computer's RAM (Random Access Memory) during execution, such a reference item can refer to another item that is stored in an area of the RAM which is outside the area used to store the program.

Hereinafter, reference items that include at least a reference to an item included in the content are referred to as "explicit reference items", while reference items that include at least a reference to an item that is external to the content are referred to as "implicit reference items".

Back to FIG. 2, whilst not shown in the figure, following the last reference item 210 there are seventy items. For the matter of convenience, these seventy items (including item 211) are referred to, hereinafter, as "terminating items" 212. The seventy items include non-reference items (such as item 211) and/or implicit reference items (such as item 213). It should be clarified that the size of any content being updated according to this example is not limited and accordingly any size of any block along this content is non-limited too.

Although not shown in FIG. 2, non-reference items can exist between reference items, and there is no requirement that reference items be continuous. For example, there could be one or more non-reference items somewhere between the reference items 206, 208, . . . , 210.

The update package 201 is adapted to modify the old version 202 of the content, generating a new version 203 of the content. An update process operates in accordance with the update package 201 to generate this new version 203.

One difference between old version 202 and new version 203 in the example, is the absence of block 204 from the new version 203, where the second block 205 shifts backwards and occupies the block 204 on the storage device. According to the example, block 204 includes five items, and therefore the second block 205 shifts five items backwards. It can be appreciated, thus, that further to block 205's shift backwards, all the items included therein are shifted correspondingly (by five items). Such is the case, e.g., also with items 207 and 209 (and their corresponding items 207' and 209' in the new version). It is noted that item 206 includes a reference to item 207. After shifting item 206 backwards to generate item 206', this item still references item 207, i.e., it references the address of 207 in the old version. It is required to replace the content of item 206' so it will reference item 207' in its new location in the new version.

It should be noted that the content of the non-reference item 211 that includes no reference and the content of the implicit reference item 213 do not require modification in this case, although their location is also shifted up by five items. It should also be noted that throughout the description, examples applied to explicit reference items are also applicable with reference to implicit reference items, unless specifically noted otherwise.

Reverting now to the update package 201, it includes commands for updating the old version 202 to the new version 203. It should be considered that in the current example commands are illustrated as string characters representing one or more operation to be performed by updating the old content (such as "copy", "replace" etc.). However, other ways to represent commands are also applicable, such as using operation codes (shortly referred to as op-codes), wherein each command has a predetermined op-code assigned to it. In addition, sometimes commands are represented by alternative ways to those illustrated in 201. For example, a "replace" command can be represented by an insert command, where the inserted content replaces the existing content.

As shown, the first command included in package 201 is to delete five items, thereby deleting the first five items in 102, being block 204. Next, the update package includes a command to copy five hundreds items to the beginning of the new version, thereby shifting the block 205 five items backwards, giving rise to block 205'.

After copying block 205, prima facie it would be required to copy items 206, 208, . . . , 210, while shifting their location five blocks up, giving rise to the corresponding items 206', 208', . . . , 210'. However, as explained before, the included references of items 206', 208', . . . , 210' needs to be updated to reference 207', 209', . . . instead of 207, 209, . . . . That is, these reference items or at least part of them need to be replaced. Instead of copying a reference item and then replacing it by a shifted reference, it is possible to replace the item on the first hand, saving the copy operation. The update package 201 includes therefore a hundred replacement commands, one for each reference item 206, 208, . . . , 210, for replacing them by a reference to the corresponding shifted item (206', 208', . . . , 210').

Following the hundred replacement commands, the update package 201 includes a copy command that copies the seventy terminating items 212 to follow the replaced hundred reference items in the new version 203, i.e., the seventy items (including item 211 and 213 that gives rise to items 211' and 213') shifted five items backwards in the new version 203.

A person versed in the art can appreciate that the update package 201 in the example above includes, amongst others, a hundred replacement commands wherein each command includes a replacing item. That is, the update package 201 includes a hundred replacing items. Bearing in mind that update packages can be transferred over limited bandwidth communication lines, such as internet or mobile (cellular) networks, reducing the size of update packages would be beneficial.

Thus, unlike the existing method in the art for generating and applying update packages, the invention discloses other methods that can produce more efficient update packages, or "compact update packages" as referred to hereinafter. One embodiment for generating such efficient update packages is referred to, hereinafter, as 'integer notation embodiment', wherein this embodiment generates 'integer shift rules'. The background for explaining integer shift rules is exemplified below, with reference to FIGS. 2 and 3.

Figure 3:
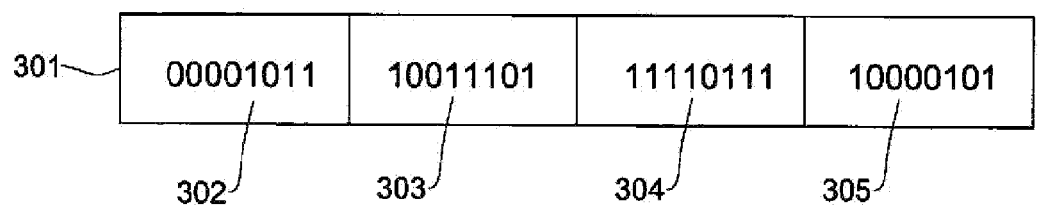
FIG. 3 is a schematic illustration of an integer value representing an item, in accordance with one embodiment of the invention.

It should be appreciated that according to some embodiments of the invention it is possible to use integer values for representing items in the old and new content (202 and 203 respectively). It can be appreciated that items are data stored on a storage device such as disk or memory. If the size of an item is four bytes, it is possible to visualize the data stored in an item as an integer number occupying the four bytes. FIG. 3 is a schematic illustration of an integer representation of a four-byte item 301, according to one embodiment of the invention. The most significant byte (left-most byte) 302 is occupied by the binary value 00001011 (0x0B in hexadecimal), the second byte 303 is occupied by the binary value 10011101 (0x9D in hexadecimal), the third 304 by the value 11110111 (0xF7 in hexadecimal) and the least significant byte 305 by the value 10000101 (0x85 in hexadecimal). The four bytes can thus be interpreted as one integer having the hexadecimal value 0x0B9DF785. That is, the integer 0x0B9DF785 is the integer representation of item 301, or int(301) as referenced hereinafter. It should be noted that 'int' stands for 'integer'.

It should be noted that any item, including non-reference items, can be represented by integers as well, and therefore int(211), for example, is the integer representation of item 211.

Reverting now to FIG. 2, the explicit reference item 206, for example, can include a program instruction "jump to the absolute address of item 207". If the absolute address of item 207 is 0x9DF785, then the instruction included in item 206 is equivalent to "jump to 0x9DF785". Program instructions can be represented by predetermined op-codes. Hence, the op-code for "jump to" can be, for example the decimal integer '11' (or 0xB in hex). As was explained before with reference to FIG. 3, the integer representation of item 206 according to this example is 0x0B9DF785. The op-code in this case is represented by byte 302, while the bytes 303, 304 and 305 are indicatives to the referenced item. That is, the bytes 303, 304 and 305 together are indicative of the referenced item, or ind(207) as referred to hereinafter. It should be noted that 'ind' stands for 'indicative'.

Alternatively, it is possible to view the whole integer as indicative of the referenced item. According to this example, if item 206 includes the instruction "jump to item 207" then the integer 0x0B9DF785 can be considered as ind(207), unlike the previous embodiment, where only 0x9DF785 was considered as the indicative value. It should be appreciated that there may be another reference item (although not shown in FIG. 2) that can include an instruction such as "call item 207" wherein the op-code for the call instruction is the decimal integer 27 (or 0x1B in hex). According to this example, int(reference item) is 0x1B9DF785. In addition, 0x1B9DF785 can be referenced in this case as ind(referenced item) or ind(207). That is, according to this embodiment there can be more than one indicative value to an address of a referenced item.

It can be further appreciated that indicative values can be any part of (including the whole) an integer representation of an item. Also, the example referred to a four-byte size of an item. This size was used here (and will be used again below) only as an example, and any applicable item size can be used. Note also that representing numbers as integers is only a non limiting example; and other known per se number representations are applicable.

Bearing in mind that an item (including a reference item and/or a non-reference item) can be represented by an integer value, and reverting back to FIG. 2, it is possible to express replacement commands in update package 201 in terms of integers. For example, "Replace int(206), int (206')" is equivalent to "Replace 206, 206'" that is part of the update package 201.

Figure 4:
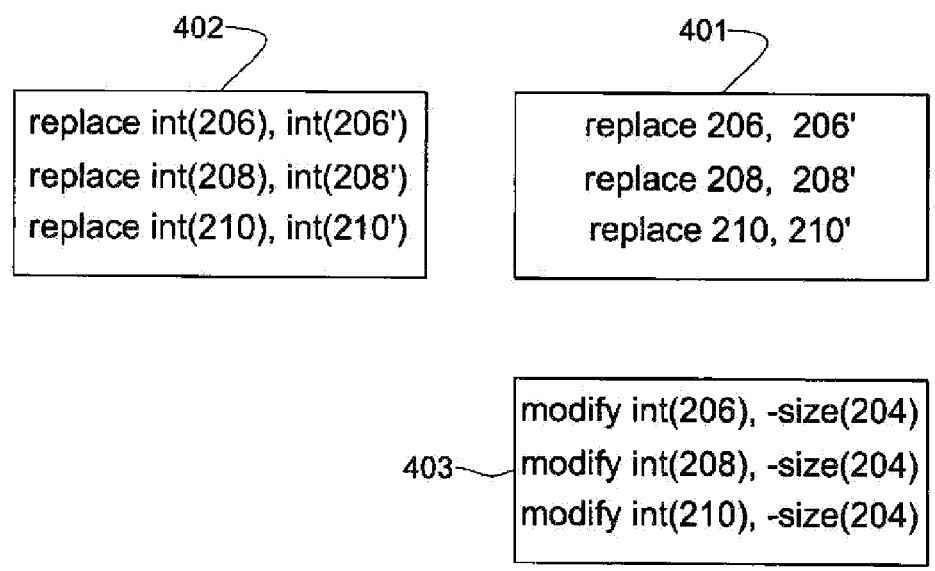
FIG. 4 illustrates a portion of the update package of FIG. 2 using integer notation, in accordance with one embodiment of the invention.

FIG. 4 illustrates a portion of the update package of FIG. 2 using integer notation, according to one embodiment of the invention. Portion 401 is the portion of the update package 201 that includes replacement commands. It is noted that portion 401 is in accordance with the prior art. It should be noted that any replacement command in this example is associated with two reference items, one in the old version and one in the new version. The two reference items are referred to, hereinafter, as a "replacement pair".

A person versed in the art can appreciate that 402 is equivalent to portion 401, wherein the replacement commands are expressed using the integer notation, in accordance with one embodiment of the invention. When using the integer notation, there are two integers associated with each replacement command. The two integers are referred to, hereinafter, as an "integer replacement pair". One integer in an integer replacement pair is referred to as a "pre-modification integer" (representing the item in the old version) and the second is a "post-modification integer" (representing the item in the new version).

Looking at the integer replacement pairs for the explicit reference items in the old version 202, i.e., looking at the integer replacement pairs in 402, it is possible to see that the integer values reflect the shift of the referenced items. For example, it is possible to view the integer replacement pair <int(208), int(208')>, when items 208 and 208' references items 209 and 209' respectively. If the item 209 was originally located at address 0x9DF785, wherein the size of an item is four bytes, then after shifting the content of item 209 five items backward (i.e., 20 bytes backward) to yield item 209', this item 209' will be located at address 0x9DF771. Bearing in mind that the least significant bytes of the reference item include a value indicative of the referenced item's address, it can be understood that the least significant bytes of the integer representing reference item 208 are 0x9DF785 (that is, item 208 references item 209), and the least significant bytes of the reference item 208' are 0x9DF771 (i.e., item 208' references item 209'). The difference between the two integers comprising together an integer replacement pair reflects, therefore, the shift that is performed while updating old version 202 to new version 203. This difference is referred to, hereinafter, as "modification difference". Modification difference is represented by diff together with the integer modified, such as diff(208).

Thus, instead of associating a pre-modification integer and a post-modification integer in an integer replacement pair, it is possible to associate a pre-modification integer or a post-modification integer with a modification difference. A pair associating a pre-modification integer together with a modification difference is referred to, hereinafter, as "integer shift pair".

Back to FIG. 4, 403 is a portion equivalent to the portions 401 and 402 that is using integer shift pairs notation.

The description with reference to FIGS. 3 and 4 provides a background for understanding an embodiment of the invention that utilizes the integer notation, hereinafter, the 'integer notation embodiment'.

Figure 5:
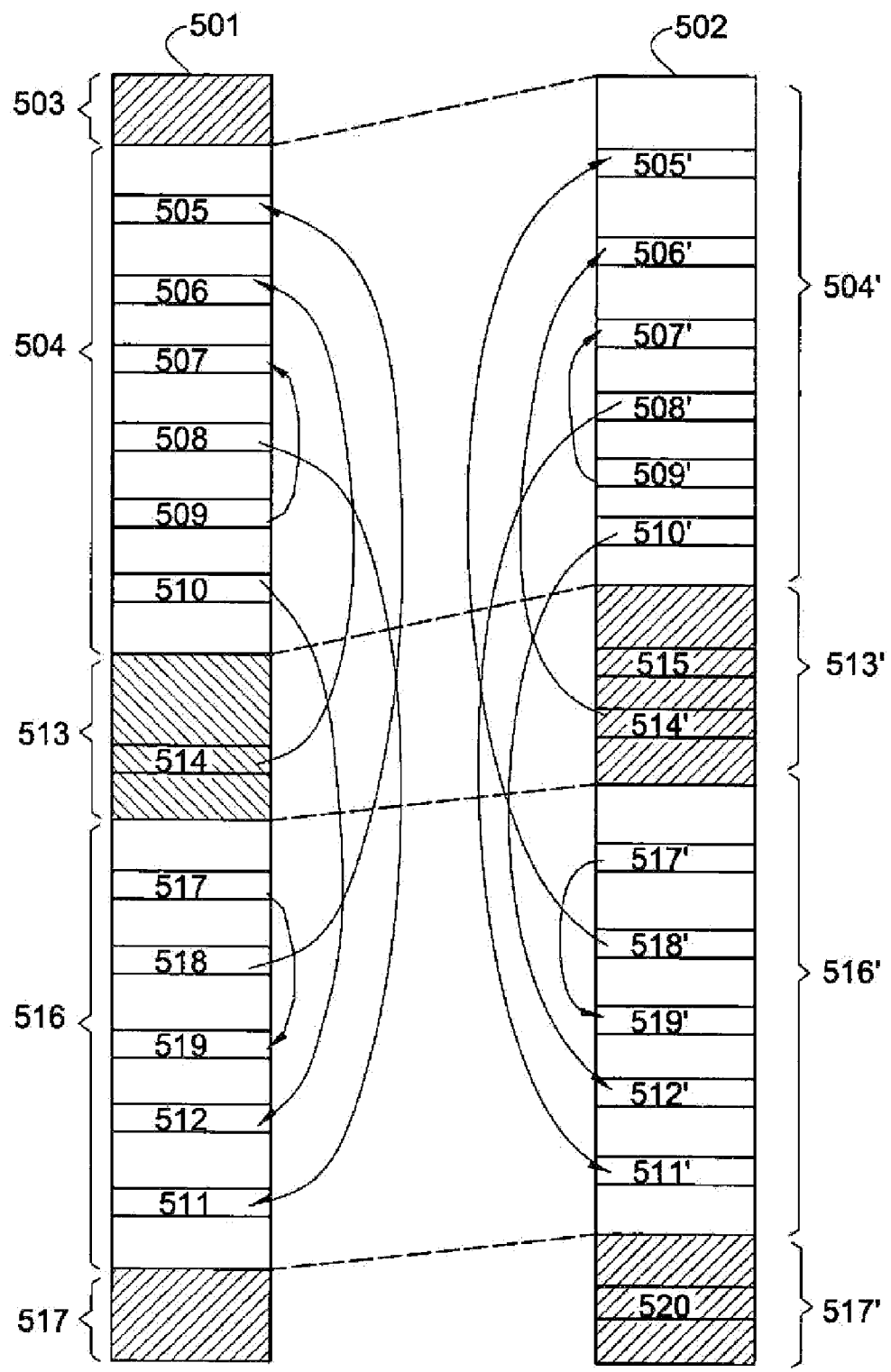
FIG. 5 is a schematic illustration of an old version and a new version received from update thereof, in accordance with one embodiment of the invention.

FIG. 5 illustrates a more complex example of old and new versions (compared to the old and new versions illustrated in FIG. 2) in order to exemplify and explain the integer notation embodiment. In the figure, an old version 501 is updated to give rise to a new version 502. Thus, the old version 501 includes a block 503, deleted while generating the new version 502. The size of the deleted block is referred to, hereinafter, as size(503). Following the example of FIG. 2, it can be understood that further to the deletion of block 503, the items in the new version are expected to be shifted backwards by size(503) items backwards.

In the old version, block 504 follows block 503. Six items (505, 506, 507, 508, 509 and 510) are marked within block 504. The addresses where the items begin are marked, hereinafter, as addr(item), e.g., addr(505), addr(506) and addr (507) etc. The blocks 508, 509 and 510 are explicit reference items. The item 509 references item 507, and items 508, 510 reference items 511 and 512 respectively. It is noted that items 511 and 512 are part of the old version, and are located forward to block 504. Thus, the explicit reference items 508, 509 and 510, include values indicative of addr(511), addr (507) and addr(512) respectively.

In the new version 502 the block 504' corresponds to block 504. As expected, the block 504' is shifted backwards by size(503). The items 505', 506', 507', 508', 509' and 510' correspond to items 505, 506, 507, 508, 509 and 510 respectively. Like block 504', the items 505', 506', 507', 508', 509' and 510' are also shifted backwards by s size(503).

Following block 504 the old version 501 includes a block 513 having one item 514 marked therewith. The item 514 is an explicit reference item that references item 506, i.e., the reference item 514 includes a value indicative of the address addr(506). In the new version, block 513' corresponds to block 513 and item 514' corresponds to item 514. However, a new block 515 of one or more items is inserted into block 513', before item 514'. That is, size(513')>size(513). According to this example, size(515) is smaller than the size(503) and therefore it can be appreciated that item 514' is shifted backwards by (size(503)−size(515)).

Back to the old version 501, there is a third block 516 following block 513. Five items are marked within this block, specifically these are items 517, 518, 519, 511 and 512. Items 517 and 518 are explicit reference items referencing items 519 and 505, that is, items 517 and 518 include values indicative of the referenced items 519 and 505 or, in other words, indicative of addr(519) and addr(505) respectively.

In the new version, block 516' corresponds to block 516. Likewise, items 517', 518', 519', 511' and 512' correspond to items 517, 518, 519, 511 and 512 respectively. Following the insertion of block 515 to block 513' it can be appreciated that the items in clock 516' are shifted backwards by (size(503)−size(515)) items.

The example of FIG. 5 illustrates also the existence of a terminating block 517 in the old version, corresponding to block 517' in the new version. The update process inserts a new block 520 of one or more items to block 517'. According to the example the size of the new block 520 is (size(503)−size(515)), and therefore the total size of the new version 502 is substantially similar to this of the old version 501.

It should be noted that the example provided with reference to FIG. 5 is by no means binding. An old or new version of any content can be comprised by any number of blocks, each including any number of items as applicable to the case. Similarly, while updating an old version to a new version, the update process can insert, delete, replace and/or perform any required operation, as many times as required, wherein the size of items or blocks may vary, depending upon the particular application.

It should also be noted that the size of an item is non-limited as well, but hereinafter, the size of an item in the content illustrated in FIG. 5 is demonstrated as four bytes.

A person versed in the art can appreciate that for updating the old version 501 to new version 502, according to one embodiment it is possible to copy block 504 and a first portion of block 514 to the new version, insert the new block 515, and then copy the second portion of block 514 together with blocks 516 and 517 to the new version. However, as was already explained with reference to FIG. 2, doing so, the explicit reference items in the new version will reference items in their original addresses, as were in the old version. For example, in the old version the explicit reference item 508 references item 511 and therefore the least significant bytes of item 508 include a value indicative of addr(511). In the old version item 508 is located at addr(508). After copying block 504 to the new version, it is appreciated that item 508 is located at addr(508') which is backward to addr(508) in this example. However, item 508 still includes reference to item 511, that is, it includes a value indicative of addr(511), where it is expected to include a reference to item 511' by including a value indicative of addr(511'). Therefore, according to the embodiment, after copying content from the old version to the new one and after inserting new blocks (such as block 515) the update package can include commands for replacing reference items, such as "in 508' replace the value indicative of addr(511) with a value indicative of addr(511')", or shortly, "Replace 508, 508'".

Having provided a background discussion of the integer notation embodiment (with reference to FIGS. 3 and 4 above) and exemplary old and new versions (FIG. 5), there follows a description (with reference to FIG. 6) exemplifying how to obtain a portion of the update package in accordance with the integer notation embodiment, compared with an equivalent portion of the update package obtained in accordance with the prior art. As will be evident from the description the portion obtained in accordance with this embodiment of the invention can be considerably smaller than that obtained in accordance with methods known in the prior art.

Figure 6:
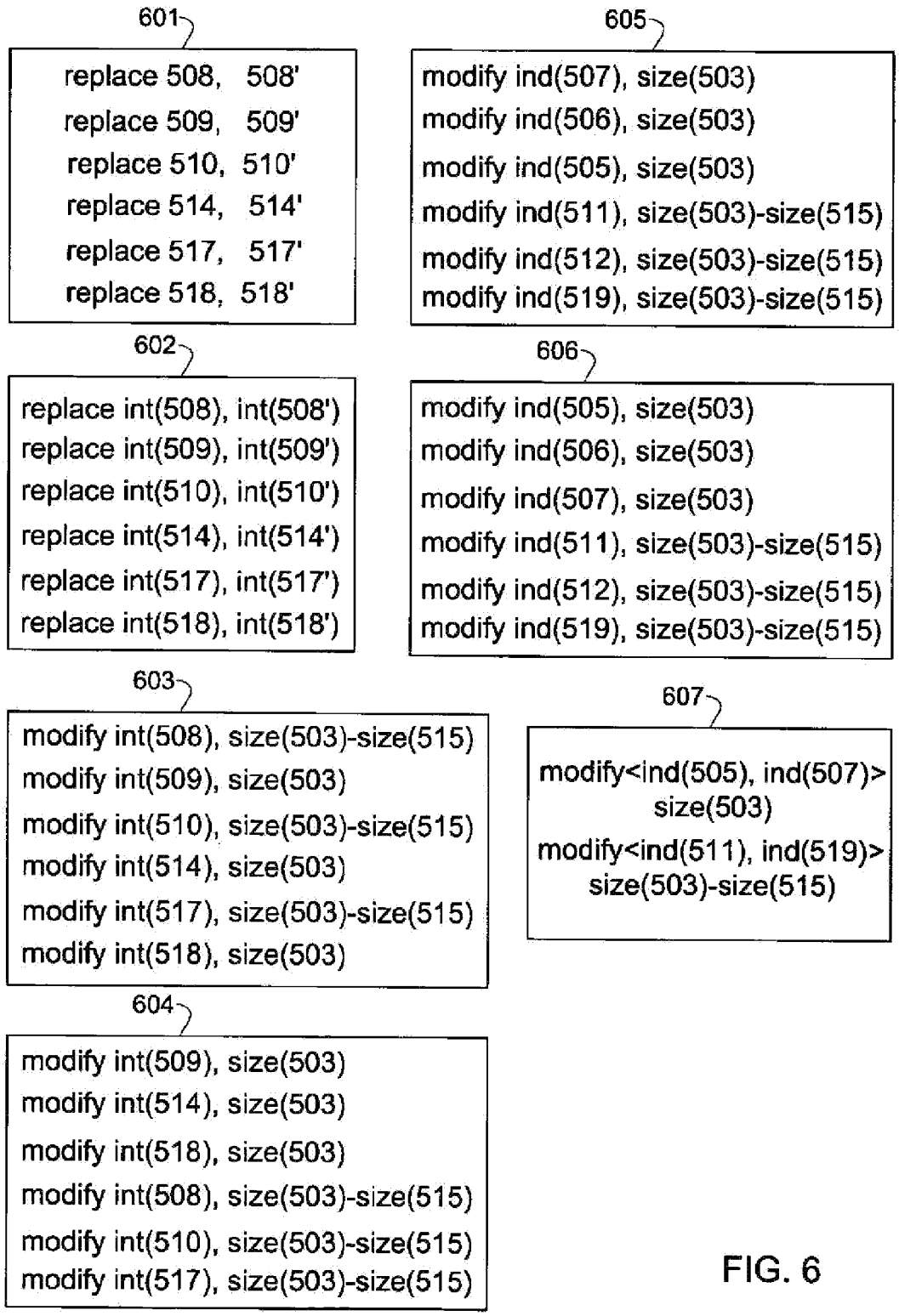
FIG. 6 illustrates a portion of the update package used to update the old version of FIG. 5 to the new version thereof.

Turning now to FIG. 6, portion 601 contains replacement instructions for updating the explicit reference items illustrated in FIG. 5. It is noted that portion 601 is generated by applying a conventional diff methods on the old and new versions of FIG. 5. It is also noted that 601 is a portion of the complete update package used to update the old version 501 to the new version 502 (the complete update package is not illustrated). The portion includes only replacement commands, while other commands such as insert and/or delete are omitted. It should be noted that in the example of FIG. 5 there are six reference items, and therefore there are six replacement commands in the portion 601. Portion 602 is an equivalent portion to 601, expressed in terms of integer replacement pairs, where in light of the description of FIGS. 3 and 4 it can be understood that for a reference item the term 'int(item)' reflects the address reference thereby.

It was further explained, with reference to FIG. 4, that instead of using integer replacement pairs' notation it is possible to express a replacement command in terms of integer shift pairs. That is, instead of replacing a reference item, it is possible to modify the reference included therein, regardless of other information stored therewith such as an op-code, to reflect the shift in the referenced item's location.

From FIG. 5 it arises that the modification difference of some of the items in the example is size(503), while other items are characterized by a modification difference of (size(503)−size(515)). Therefore, it is possible to change portion 602, while instead of using replacement commands, it is possible to use modification commands using pre-modification integer shift pairs notation, as illustrated in 603.

It should be noted that the modification difference in an integer shift pair is indicative of the referenced item's shift, and not of the reference item's shift.

In 604 the same portion of the update package is illustrated, where the modification commands are sorted according to the modification differences. It should be noticed that the sorted portion 604 includes two groups. One group includes commands for modifying int(509), int(514) and int(518), wherein the modification difference is size(503). The second group includes commands for modifying int(508), int(510) and int (517), wherein the modification difference is (size(503)−size(515)).

It should be recalled that an integer or part thereof is indicative of a referenced item's address. It should also be considered that while updating a reference item the reference needs to be modified regardless of the op-code or any other information being associated with it. Therefore, in an integer shift pair, instead of referring to an integer it is possible to refer to the value indicative of the referenced item, or to 'ind(referenced item)'. A pair of ind(referenced item) and its associated modification difference is referred to, hereinafter, as an "indicative shift pair".

It should be noted that although not shown in FIGS. 5 and 6, sometimes there are more than one reference item referencing the same referenced item. If the referenced items' indicative values are part of the referencing items' integer representation, all these referencing items can sometimes be represented by a similar indicative value. If the entire integer is used as the referenced item's indicative value, there may be more that one indicative value representing the referencing items.

For example, a referenced item's address is 0x5F8B23. Four reference items reference this item by designating its address. The first has an op-code 0xA2, the second has an op-code 0x0F and the third, 0x1B. The forth reference item has an op-code similar to the first (i.e., 0xA2). If the indicative value is represented by the three least significant bytes then all four reference items will be represented as ind(0x5F8B23). On the contrary, when the whole integer is used as an indicative value, there will be three different indicative values representing the four reference items. The first and the forth reference items will be presented as ind(0xA25F8B23), the second will be represented as ind(0x0F5F8B23), and the third as ind(0x1B5F8B23).

Reverting back to FIG. 6, in 605 a sorted portion equivalent to 604 is illustrated, using the indicative shift pairs notation. 605 illustrates that when shifting reference items referencing items in block 504, the indicative values therein should be modified to reflect a shift of size(503). When shifting reference items referencing items in block 516, the indicative values therein should be modified to reflect a shift of (size(503)−size(515)).

Seeing that the two groups exist also in 605, it is possible to sort each group internally according to the ind(referenced item), and consequently generating 606. Instead of having three modification commands for modifying reference items having values indicative of items in block 504, it is possible to generate one composite modification command to update all the values indicative of items in block 504 to reflect a shift of size(503). In other words, if a reference item includes a value indicative of an item that is between 505 and 507, included, this value should be modified to reflect a shift of size(503). In the same way, instead of having three modification commands for modifying reference items having values indicative of items in block 516, it is possible to generate one composite modification command to update all the values indicative of items in block 516 to reflect a shift of (size(503)−size(515)). In other words, if a reference item includes a value indicative of an item that is between 511 and 519, included, this value should be modified to reflect a shift of (size(503)−size(515)), as illustrated in 607. Such a composite modification command is referenced, hereinafter, as an integer shift rule. That is, 607 demonstrates two integer shift rules that can be applied in order to update the explicit reference items in the example of FIG. 5.

Thus, it can be appreciated that the portion 607, using integer shift rules is equivalent to portion 601, using replacement commands. Yet, portion 607 includes only two integer shift rules, instead of six replacement commands that are included in 601. Hence the update package including portion 607 is equivalent to an update package including portion 601. If the space required for storing an integer shift rule is smaller than the space required for storing its equivalent replacement commands, it is possible to reduce the size of an update package by using the equivalent integer shift rule.

The reduction in the update package size can be significant. Considering, for example, a non limiting application of updating version of software on cellular telephones, an integer shift rule can sometimes save even tens of thousands replacement commands.

It should also be noted that instead of using integer shift rules, any numeral shift rule can apply as well, therefore, hereinafter, the term 'numeral shift rule' is used.

Figure 7:
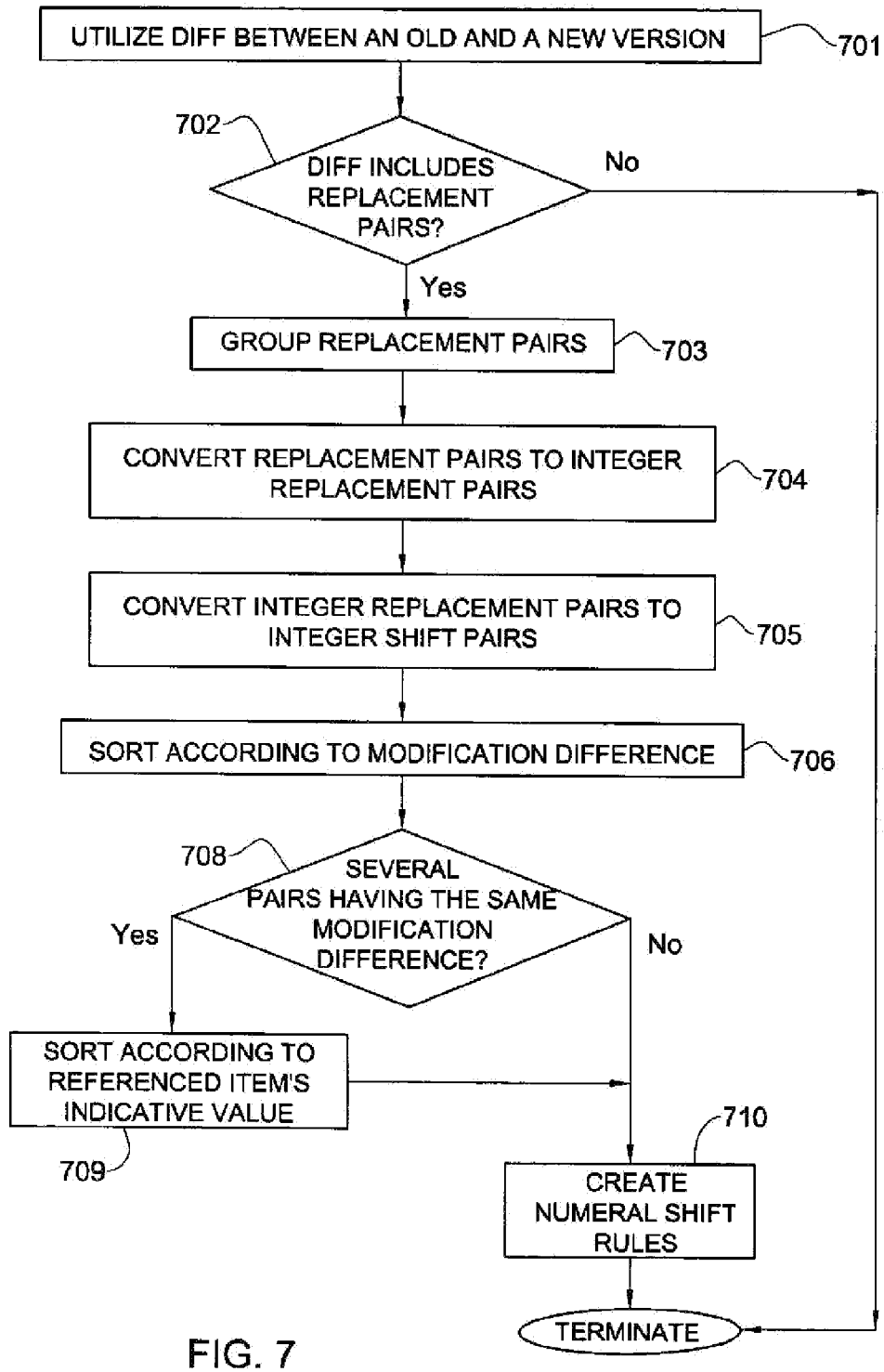
FIG. 7 is a flowchart describing in detail the generation of numeral shift rules in an update package, in accordance with one embodiment of the invention.

FIG. 7 is a flowchart describing in detail the generation of numeral shift rules in an update package, in accordance with one embodiment of the invention. It should be appreciated that in order to create an update package and numeral shift rules, diff should be utilized (701, in any method known per se) between an old version and a new version in order to detect differences between the two versions. There are many tools available today for detecting differences between versions, such as the UNIX diff program. The cliff generates pairs of differences between the old and new versions, amongst can be replacement pairs. If the diff includes replacement pairs (702), at least some of them are grouped together (703) to form a portion of the diff, thus creating, for example, a portion like the portion 601 of FIG. 6. Next (704), the replacement pairs are converted to form integer replacement pairs, using the integer notation as was exemplified before with reference to FIGS. 4 and 6 (see 402 and 602 therein).

After converting the replacement pairs to integer replacement pairs the integer replacement pairs are converted (705) to be integer shift pairs, by associating the pre-modification integers together with their modification difference, a stage that was previously exemplified with reference to FIGS. 4 (403) and 6 (603). The integer shift pairs are sorted (706) according to the modification differences as in FIG. 6, block 604.

After sorting, the pre-modification integers in the integer shift pairs are replaced (707) by the respective referenced items' indicative values to form indicative shift pairs, a stage exemplified before with reference to FIG. 6 (605). It should be noted that in those cases when there are several indicative shift pairs having the same modification difference (708), these indicative shift pairs are sorted (709) in accordance with their indicative value. In those cases when the whole integer is considered as the referenced items' indicative value, it is appreciated that the block 707 is redundant and can be skipped, while the int value serves instead of the ind throughout the rules' generation process. The blocks 606 of FIG. 6 is an example to block 709 in the current figure.

If there are groups including more than one indicative shift pairs having the same modification difference, the indicative shift pairs in a group can be joined (710) to form a numeral shift rule indicating the first and last referenced items' indicative values in the group and the modification difference characterizing them, as was previously exemplified with reference to FIG. 6 (see 607).

It is noted that sometimes further optimizations are applicable. For example, if there are two numeral shift rules having the same modification difference, wherein the last referenced item's indicative value of the first rule and the first referenced item's indicative value of the second rule are close enough, the two rules can be joined to form one joined numeral shift rule. The joined numeral shift rule indicates the first referenced items' indicative value of the first numeral shift rule and the last referenced items' indicative value of the second numeral shift rule, together with the modification difference that characterizes them. It should be noted that when two non-adjusting numeral shift rules are joined, the numeral shift rule (or indicative shift pairs) between them are swallowed by the joined rule, and therefore their pre-modification reference items are susceptible to erroneous update (that is, they may be updated to reflect an erroneous shift).

It should be noted that the invention is not bound to the specific sequence of operation and manner of obtaining the integer shift rules as described in FIG. 7, or to the integer shift rule terminology used in portion 607 of FIG. 6.

In addition, the embodiments illustrated so far reduce the size of an update package by using numeral shift rules, thus generating a compact update package. It is noted that in those cases using different terminologies to describe an update package such as "delta" or "difference" of "diff", the compact update package could be named also, e.g., "compact difference results".

According to a different embodiment, sometimes content can be accompanied by associated descriptive data referred to, hereinafter, as 'meta-data'. Common forms for providing meta-data are symbol tables, debug tables and linker map used to describe computer programs. However, meta-data is not limited to computer programs and other types of content can have meta-data as well. It should also be noted that associated meta-data can be separated from the content, for example by storing it in a different file or by storing it in a database. Alternatively, the meta-data can be stored as part of the content, as applicable to the case.

Figure 8:
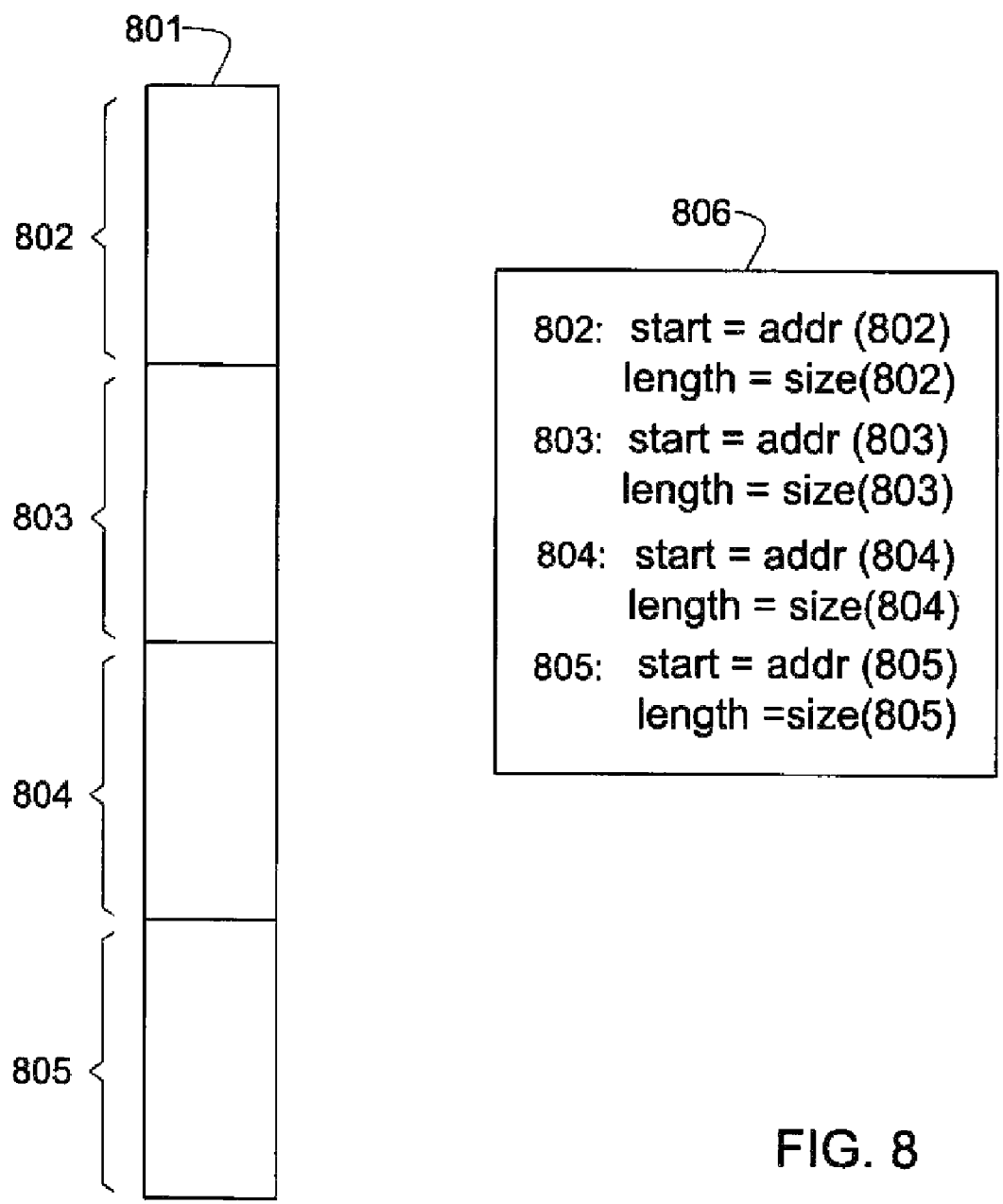
FIG. 8 illustrates exemplary content and associated meta-data, in accordance with one embodiment of the invention.

FIG. 8 illustrates exemplary content and associated meta-data. Content 801 includes four blocks 802, 803, 804 and 805. Block 803 starts at address addr(803), block 804 starts at addr(804), and block 805 starts at addr(805). The associated meta-data 806 describes the content and the blocks thereof, wherein for each block the meta-data 806 provides a start address and the length of the block. It should be notified, however, that this is a non-limiting example and meta-data can include other data instead of the start address and length of each block.

When generating an update package intended to update an old version of content to a new version thereof, if meta-data is associated with the content, it is possible to use the meta-data in order to encode modifications to references as will be explained below with reference to FIGS. 9 and 10.

The example and description of FIG. 8 will serve as a basis for understanding how to obtain a so called 'reference shift rule' in accordance with another embodiment of the invention, as will be explained with further detail with ref to FIG. 9, which is a schematic illustration of an old version 901 and a new version 902 received from update thereof, and with reference to FIG. 9A that is a schematic illustration of meta-data and a difference table (9A01, 9A02 and 9A03 respectively) associated with the old and new versions of FIG. 9, in accordance with one embodiment of the invention.

The old version 901 includes four blocks (905, 906, 907 and 708), their respective start addresses are addr(905), addr(906), addr(907) and addr(908). In the new version, a new block 909 of at least one item was added to block 905, thus generating the corresponding block 905'. It can be appreciated that the size of block 905' is thus bigger than the size of the block 905 by size(909). In addition, unless additional insertions of items to the content or deletions of items from the content further occur during the update process, items forward to the new block 909 are expected to shift forward by size(909).

Forward to block 905', block 906' corresponds to block 906, block 907' corresponds to block 907 and block 908' corresponds to block 708. A new block 910 of one or more items is inserted also into block 907'. The size of this new block is size(910). Thus, item forward to the new item 910 are shifted forward by (size(909)+size(910)).

In the old version, block 906 includes at least three explicit reference items 911, 912 and 913, referencing items 914, 915 and 916 correspondingly. The referenced item 914 is in block 908, the referenced item 915 is in block 907, and the referenced item 916 is in block 906. In addition, block 908 includes at least one explicit reference item 917 that references item 918. Like the referenced item 915, the referenced item 918 is also in block 907.

The meta-data 9A01 in association with the old version 901 describes the four blocks, their respective start address and their length. The meta-data 9A02 in association with the new version 902 describes the blocks included therein. By comparing meta-data 9A01 with meta-data 9A02 it can be demonstrated that the start address of block 905' in this case is similar to this of block 905 of the old version. However, the start address of block 906' equals to (addr(906)+size(909)). Likewise, the start address of block 907', when compared to the start address of block 907 of the old version also reflects a shift of size(909), that is, addr(907')=addr(907)+size(909). On the other hand, the start address of block 908' demonstrates a shift of (size(909)+size(910)), that is, addr(908')= addr(908)+size(909)+size(910).

Figure 9:
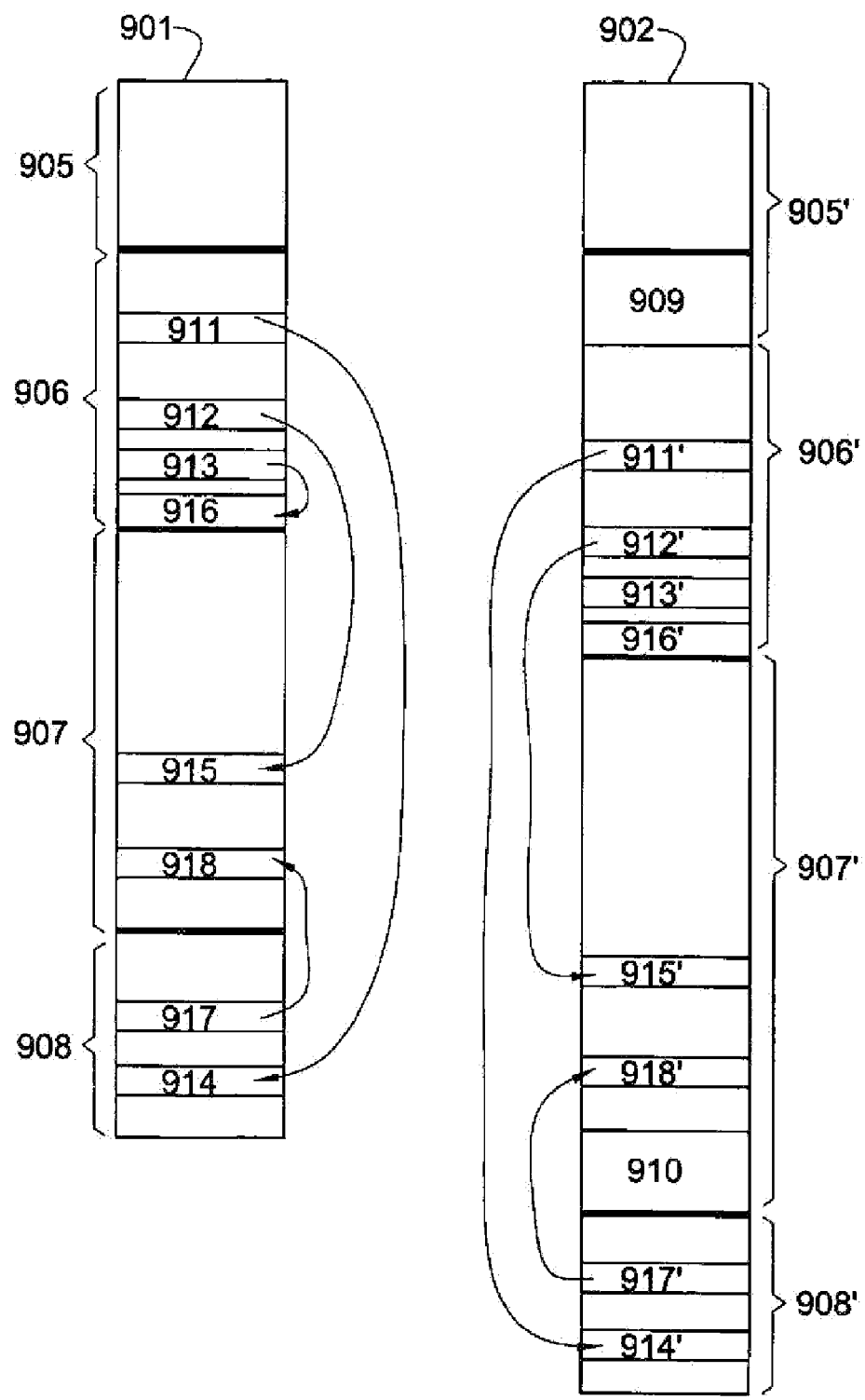
FIG. 9 is a schematic illustration of an old version and a new version received from update thereof, in accordance with one embodiment of the invention.
Figure 9A:
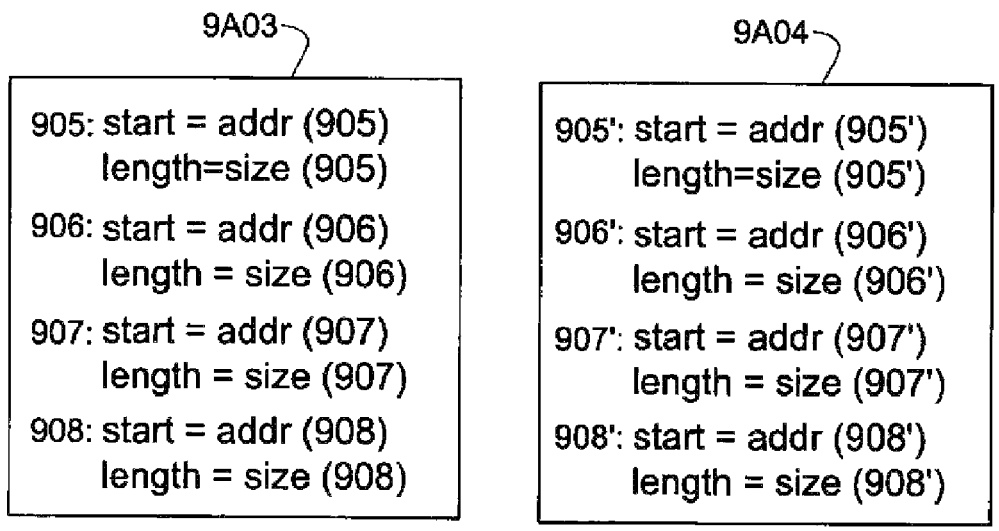
FIG. 9A is a schematic illustration of meta-data associated with the old and new versions of FIG. 9, in accordance with one embodiment of the invention.
Figure 10:
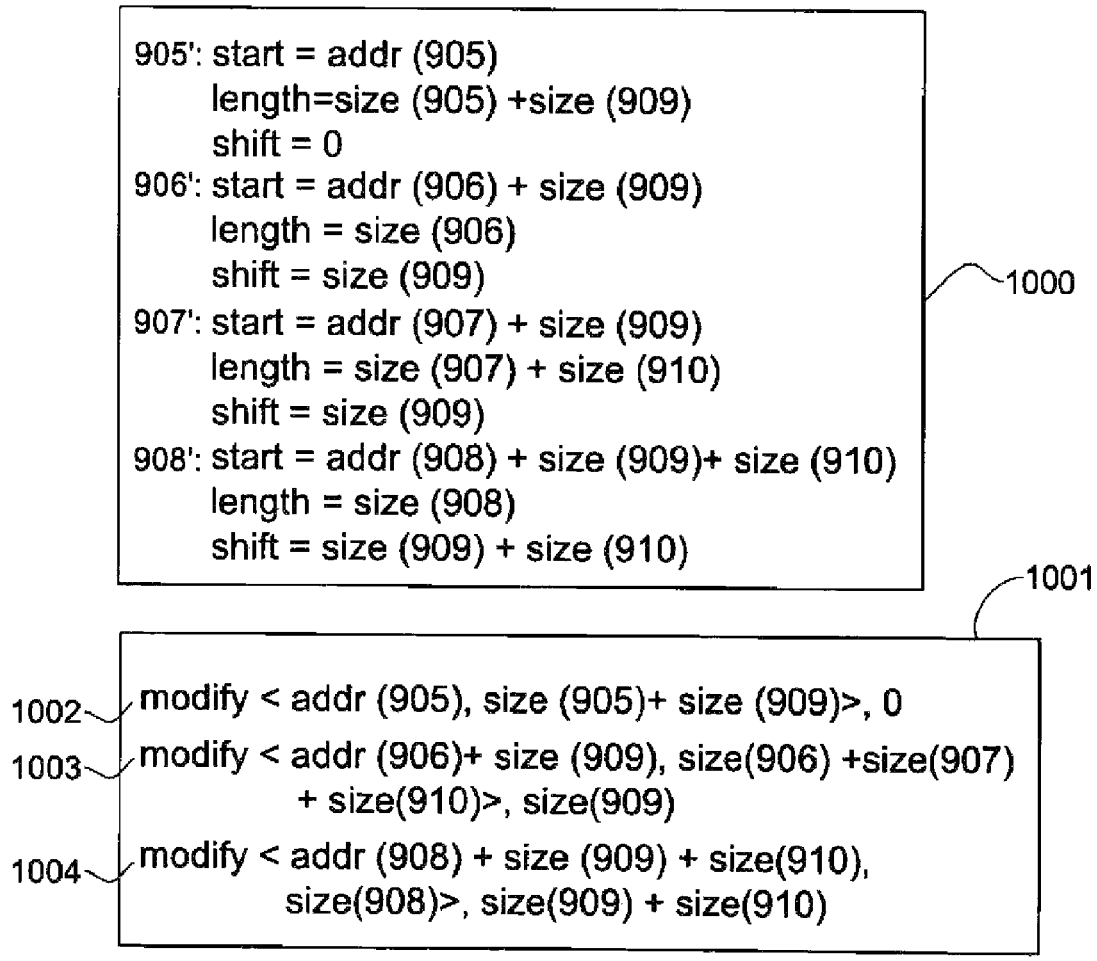
FIG. 10 illustrates a difference table and its corresponding reference shift rules in accordance with the example of FIG. 9, according to an embodiment of the invention.

Whereas the description how to obtain reference shift rules will be described below with respect to the specific example of FIG. 9, it should be noted, incidentally, that the example of FIGS. 9, 9A and 10 is non-limiting. The old and new versions can have any applicable number of blocks, new blocks and items can be inserted at any location or deleted while updating the old version to a new version. It should also be appreciated that it is possible to indicate the meta-data 9A02 of the new version by using addresses in the old version, and adding the sizes of the inserted blocks when applicable. The result, together with the modification difference (that is, the shift that characterizes the start address of each block in the old version and its corresponding block in the new version) is referred to as a "difference tables". This is illustrated in 1000 (see FIG. 10), which is the difference table corresponding to meta-data 9A01 and 9A02.

It can be appreciated that reference shift rules can be generated in accordance with the difference table 1000. If a reference item references another item in block 906' for example, and following the information in the difference table, it is possible to appreciate that in the new version its corresponding reference item should be modified to reflect a shift of size(909) in the referenced items location. In the same way if a second reference item references another item in block 908', it is possible to appreciate that in the new version its corresponding reference item should be modified to reflect a shift of size(909)+size(910) in the referenced items location.

Generally speaking, the difference table reflects therefore reference shift rules. For example, for each referenced item in block 906' the characteristic shift is size(909). In the same way for each referenced item in block 907' the characteristic shift is also size(909) whereas for each referenced item in block 908' the characteristic shift is size(909)+size(910).

It is possible to determine whether a reference item references another item in a certain block in accordance with the blocks' start address and length as indicated in the difference table. Therefore a reference shift rule may be represented by the exemplary notation "Modify <addr(referenced block), size(referenced block)>, shift".

In the example of FIG. 9A, it can be seen that blocks 906' and 907' both are characterized by the same shift. Seeing that blocks 906' and 907' are consecutive, it can be appreciated that their two reference shift rules can be joined to form one reference shift rule saying "Modify <addr(906'), size(906')+size(907')>, size(909)".

In FIG. 10, block 1001 exemplifies the reference shift rules based on the difference table 1000. In this case three reference shift rules (1002, 1003 and 1004) are illustrated.

Figure 11:
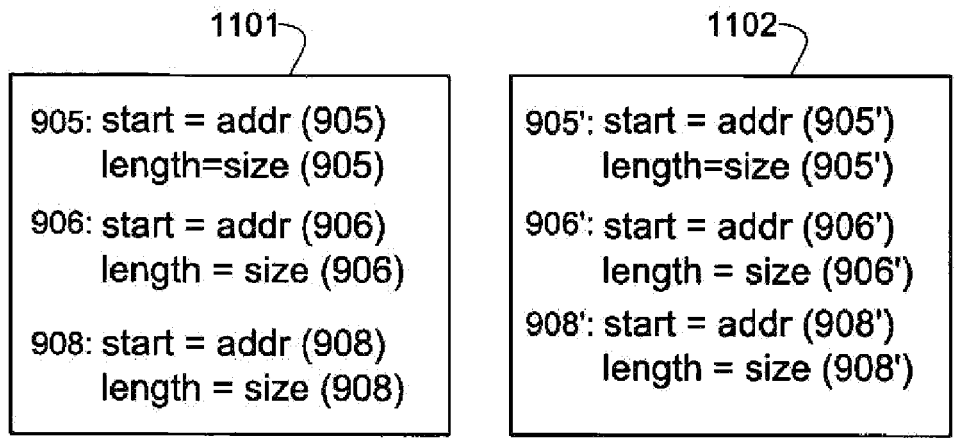
FIG. 11 is a schematic illustration of partial meta-data associated with the old and new versions of FIG. 9, in accordance with one embodiment of the invention.
Figure 12:
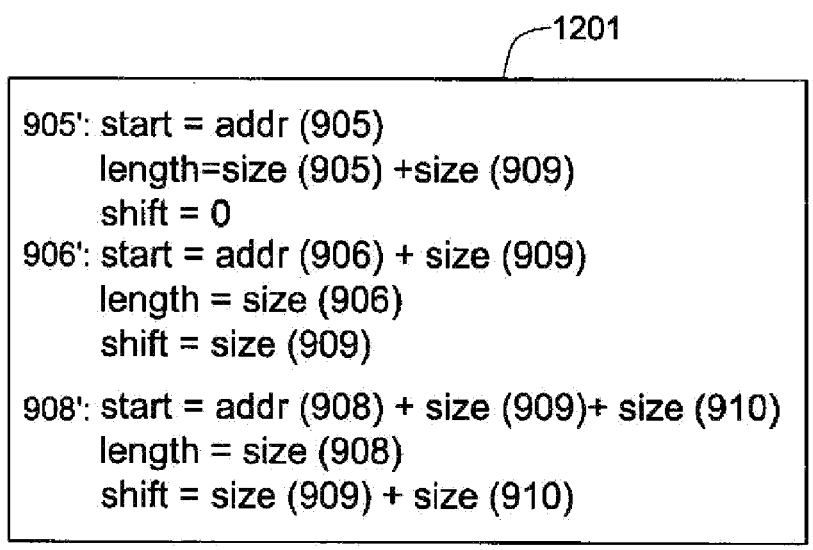
FIG. 12 illustrates a difference table and its corresponding reference shift rules in accordance with the example of FIGS. 9 and 11, according to an embodiment of the invention.
Figure 12:
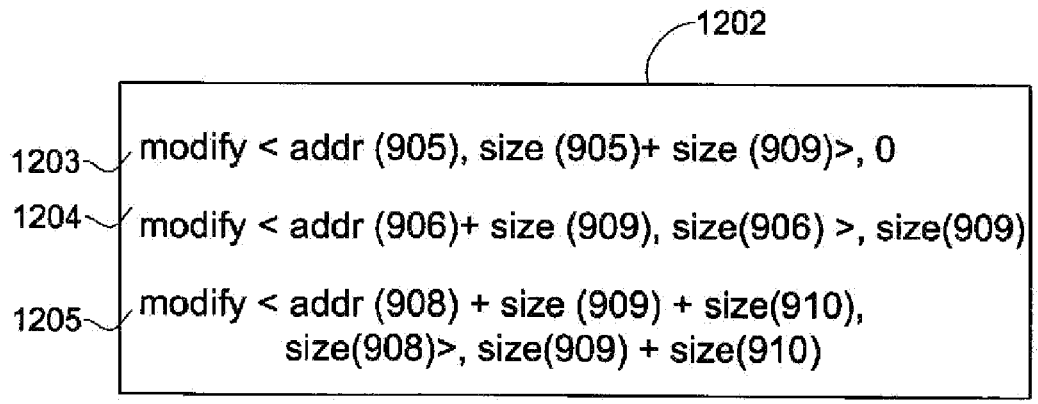

Yet, sometimes, as is known per se, the meta-data does not describe one or more blocks of the content. See for example, FIGS. 9 and 11. In FIG. 11, the meta-data 1101 of the old version 901 of FIG. 9 and the meta-data 1102 of the new version 902 of FIG. 9 are illustrated. It is noted that the meta-data 1101 and 1102 are partial, that is, block 907 and its corresponding block 907' are not described. It can be appreciated therefore, that in the difference table 1201 of FIG. 12, the differences for block 907' are not described as well. This affects the generation of reference shift rules illustrated in 1202. Like the previous example of FIGS. 9 and 10 in the current example, there are also three reference shift rules 1203, 1204 and 1205. However, because block 907' is not described, the second rule 1204 corresponds to a smaller block compared to the second rule 1003 of the previous example. Therefore, a reference item referencing another item in block 907' cannot be modified in accordance with the reference shift rules in this case.

Nevertheless, following the description of the numeral shift rules with reference to FIGS. 5, 6 and 7 above, a person versed in the art can appreciate that it is possible to try and apply numeral shift rules wherever reference shift rules are non applicable. As it may be recalled, the method for utilizing numeral shift rules does not require meta-data and therefore utilizing numeral shift rules is applicable in this case.

Figure 13:
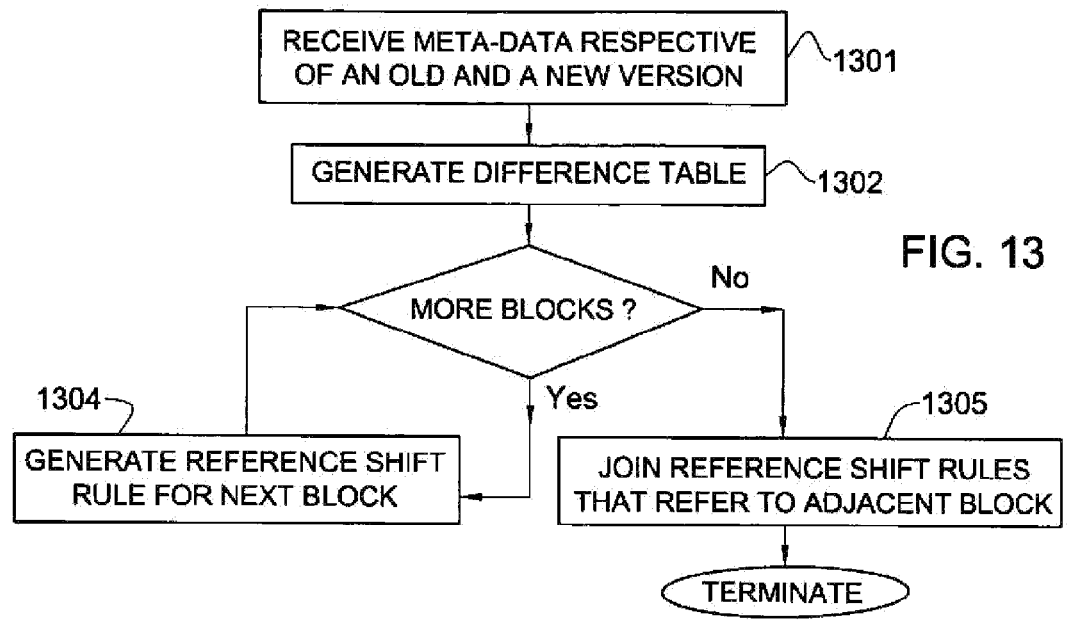
FIG. 13 is a flowchart describing in detail the generation of reference shift rules in an update package, in accordance with one embodiment of the invention.

FIG. 13 is a flowchart describing in detail the generation of reference shift rules in an update package, in accordance with one embodiment of the invention. After receiving meta-data (1301) respective of an old and a new version, a difference table (such as difference table 1000 of FIG. 10) is created (1302). The difference table includes at least information about blocks (such as their start addresses) in the old version associated with information about their respective corresponding blocks (such as their start addresses) in the new version. Alternatively, the difference table can include at least information about blocks in the old version associated with information about their respective modification differences (i.e., their shift value). It is noted that other alternatives are allowed as well, such as including at least information about blocks in the new version associated with information about their respective modification differences.

For each block described in the difference table a reference shift rule is being generated (1304). Next reference shift rules referring to adjacent blocks are joined. It should be noted that the invention is not bound to the specific sequence of operation and manner of obtaining the reference shift rules as described in FIG. 13.

It should also be noted that the notation used to describe a reference shift rules is non binding and other notations are applicable as well. For example, instead of designating the first item and the length of the block or blocks covered by the rule (in other words, a "section"), it is possible to designate the first and the last items in the section. Note that the latter applies also to numeral shift rules described with reference to FIG. 7, mutatis mutandis.

The description above describes embodiments for generating numeral and reference shift rules for updating references in reference items during update of an old version to a new version. It should be noted that the invention is not bound by the specific numeral shift rules and reference shift rules described above. More generally, the term "shift rule" refers to updating of reference items to reflect the shift of reference items in the new version.

Hereinafter, a 'conversion element' is the term used to refer to a collection of shift rules associated with an update package. That is, a conversion element can include at least one numeral shift rule, and/or at least one reference shift rule, and/or any other shift rule that can be applied while updating an old version to a new version. Thus, according to the description above, a person versed in the art can appreciate that an update package that contains at least one conversion element is a compact update package.

When applying a conversion element to an old version, it should be appreciated that sometimes reference items can be updated erroneously. For example, consider the example illustrated in FIG. 9, wherein the inserted item 910 is inserted into block 907 backwards to item 915'. This change in the example will not affect the difference table 1000 and the reference shift rules will be similar to those described in FIG. 10 (see 1001). However, it can be appreciated that items 915' and 918' are shifted forward by (size(909)+size(910)), and not by size(909) as predicted by the difference table 1000. Therefore, unlike what is indicated by the reference shift rules of 1001, the reference items 912' and 917' should be modified to reflect a shift of (size(909)+size(910)) instead of size(909).

According to an embodiment of the invention referred to, hereinafter, as "one modified" embodiment of the invention and it is possible to apply the conversion element including the reference shift rules of 1001 of FIG. 10, generating a modified version thereby, and afterwards provide remedy to the erroneous reference items affected by this conversion element by applying a diff utility between the modified version and the new version. This diff procedure, sometimes referred shortly as "diff", comparing between a modified and a new version is referred to hereinafter as "modified diff", wherein the first diff (comparing between an old and a new version), utilized in order to generate the conversion element is referred to, hereinafter, as "complete diff". The output of the complete diff is referred to as a "complete delta", while the output of the modified diff is referred to as a "modified delta".

Generally speaking, it is possible to appreciate that while the complete diff detects all the variations that exist between the old and the new versions, including for example, replacement pairs (i.e., shifted explicit reference items as explained above) and other variations such as inserted items and deleted items, the modified diff detects substantially less replacements together with possibly erroneous replacement pairs and together with the other variations. Thus, modified delta is smaller in size compared to the complete delta.

Yet, the modified delta together with the conversion element can constitute together an update package that can update the old version and create a new version thereof. Such an output package, constituted of at least one conversion element and a modified delta, is referred to, hereinafter as a "composite update package", unlike a "simple update package" that includes a complete delta and no conversion element. Bearing in mind that the conversion element can be smaller in size compared to its equivalent replacement commands, the resulting composite update package is usually smaller in size compared to the simple update package known per se. Therefore, a composite update package is considered hereinafter as a compact update package. According to an embodiment of the invention a compact update package includes at least a conversion element and a modified delta associated therewith.

It is appreciated that by applying the conversion element, and afterwards the modified diff associated with it ("forward conversion order" or in other words, "forward update indicator") in a compact update package, a new version will be generated wherein items that were erroneously modified by the conversion element will be replaced by the modified delta and amended in a way that their proper content in the new version is received (the procedures for applying update packages are discussed in detail below). However it should be noted that sometimes the modified diff should be applied before the conversion element referred to hereinafter as "backward conversion order". Backward conversion order shall be explained in detail below.

Yet, it can be illustrated that instead of joining the modified delta to the conversion element to form a compact update package, it is possible to extract additional conversion elements from the modified delta, contributing to the previous conversion element or generating an additional conversion element to be associated together with the previous one and with a delta to form an even smaller compact update package. Thus, another embodiment of the invention, referred to as an "iterations embodiment" is described below, with reference to FIG. 14.

Figure 14:
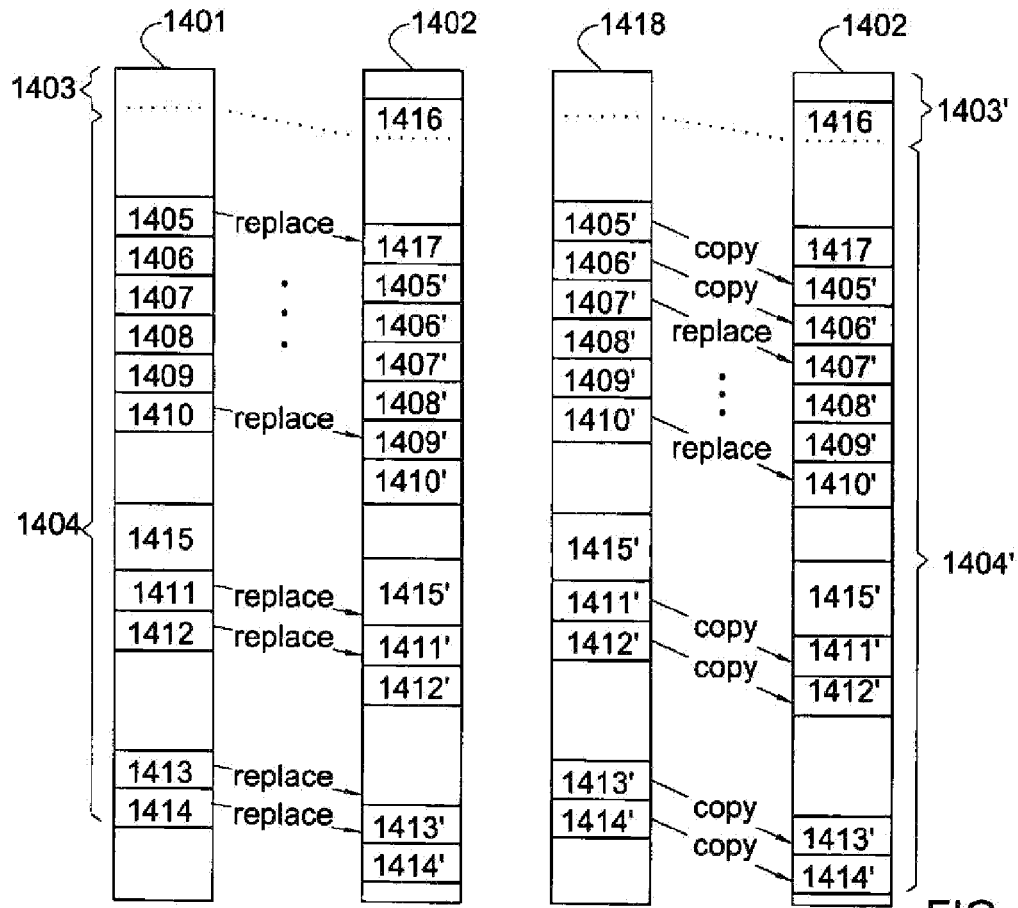
FIG. 14 is a schematic illustration of iterations updating versions of content, according to an iterations embodiment of the invention.

FIG. 14 is an exemplary schematic illustration of iterations for updating versions of content, according to an iterations embodiment of the invention. The version 1401 is an old version, while the version 1402 is the new version. The figure illustrates generation of a compact update package for updating old version 1401 to new version 1402 according to the iterations embodiment of the invention. The old version 1401 includes a block 1403. Further to block 1403 there is another block 1404 including at least some explicit reference items 1405, 1406, 1407, 1408, 1409, 1410, 1411, 1412, 1413 and 1414. The block 1404 includes also a non reference item 1415.

In the new version 1402, the blocks 1403' and 1404' correspond to blocks 1403 and 1404, while the items 1405', 1406', 1407', 1408', 1409', 1410', 1411', 1412', 1413', 1414' and 1415' correspond to items 1406, 1407, 1408, 1409, 1410, 1411, 1412, 1413, 1414 and 1415 respectively. At least one item 1416 was inserted into block 1403', thus enlarging its size by size(1416), and at least one item 1417, of size(1417) was inserted into block 1404' backwards to item 1405'.

It should be noted that the content of reference items 1405, 1411 and 1414 are substantially identical, and therefore the content of the corresponding reference items 1405', 1411' and 1414' are substantially identical as well. Similarly, the content of 1406, 1412 and 1414 are substantially identical, and therefore the content of the corresponding reference items 1406', 1412' and 1414' are substantially identical as well.

The items 1405', 1406', . . . , 1410' are explicit reference items, whose content was modified (i.e., their referenced items were shifted) in the new version compared to the old version. The same applies also to the explicit reference items 1411', 1412', 1413' and 1414'. Yet, a diff utility known per se can not recognize that item 1417 is a new item inserted into the new version 1402 while items 1405', 1406', . . . , 1410', . . . are shifted items, and therefore, the diff utility erroneously detects that item 1417 replaces item 1405. Further on the diff utility identifies that item 1415' is identical to item 1415 (and therefore a copy thereof), and synchronizes to detect (correctly, this time) that item 1411' replaces item 1411 and so on.

Thus, following a complete cliff, a complete delta is generated, indicating (partially erroneously) the following:
  1417 replaces 1405;
  1405' replaces 1406;
  1406' replaces 1407;
  1407' replaces 1408;
  1408' replaces 1409;
  1409' replaces 1410;
  1415' is a copy of 1415;
  1411' replaces 1411;
  1412' replaces 1412;
  1413' replaces 1413; and
  1414' replaces 1414.

Based on this complete delta a conversion element is generated, for example in accordance with the methods illustrated in FIGS. 7 and 13 above.

Recalling that items 1405, 1411 and 1414 are substantially identical (and so are their corresponding items), as well as items 1406, 1412 and 1414 that are substantially identical (and so are their corresponding items too), and upon detecting that 1411' replaces 1411 and that 1413' replaces 1413, the conversion element can estimate that 1405 should be replaced by 1405'. Similarly, by detecting that 1412' replaces 1412 and 1414' replaces 1414, the conversion element can estimate that 1406 should be replaced by 1406'.

This conversion element is applied to the old version 1401, generating modified version 1418. It should be noted that the conversion element modified (or converts) several items in the old version, but it does handle any other variation such as deleting and/or inserting items. Therefore, the modified version 1418 is not shifted in relation to the old version 1401.

According to the one modified embodiment of the invention, a modified diff can be utilized, comparing between the modified version 1418 and the new version 1402. The resultant modified delta would recognize the insertion of additional elements, deletion of others and replacement of the rest (amongst are the items 1407, 1408, 1409 and 1410 that where not handled by the conversion element. This modified delta, together with the conversion element, will serve as the basis for generating the compact update package.

Alternatively, according to the iterations embodiment of the invention, instead of generating a compact update package, the modified delta should serve as a basis for generation of additional new conversion elements, for example in accordance with the methods illustrated in FIGS. 7 and 13 above. This new conversion element, together with the one generated in the previous iteration will constitute together a compound conversion element. The new conversion element can be applied to the modified version 1418 to generate another modified version (not shown) to be compared by a modified diff against the new version 1402, and so on. One exemplary terminating condition for stopping the iterations is when the size of the modified delta produced by an iteration together with the size of the new conversion element is larger or equal to the size of the previous modified delta together with the size of the previous compound conversion element. When the iterations are stopped the compact update package is generated based on the compound conversion element and the modified delta.

Whereas the iterations embodiment will be describe in general terms below with respect to the flow chart of FIG. 15, it should be noted, incidentally, that the example of FIG. 14 is non-limiting. The old and new versions can have any applicable number of blocks, new blocks and items can be inserted at any location or deleted while updating the old version to a new version, any number of iterations can be performed and any applicable terminating condition (or "stop criterion") can be used to stop the iterations. That is, the process proceeds to the next iteration if the stop criterion is not met.

Figure 15:
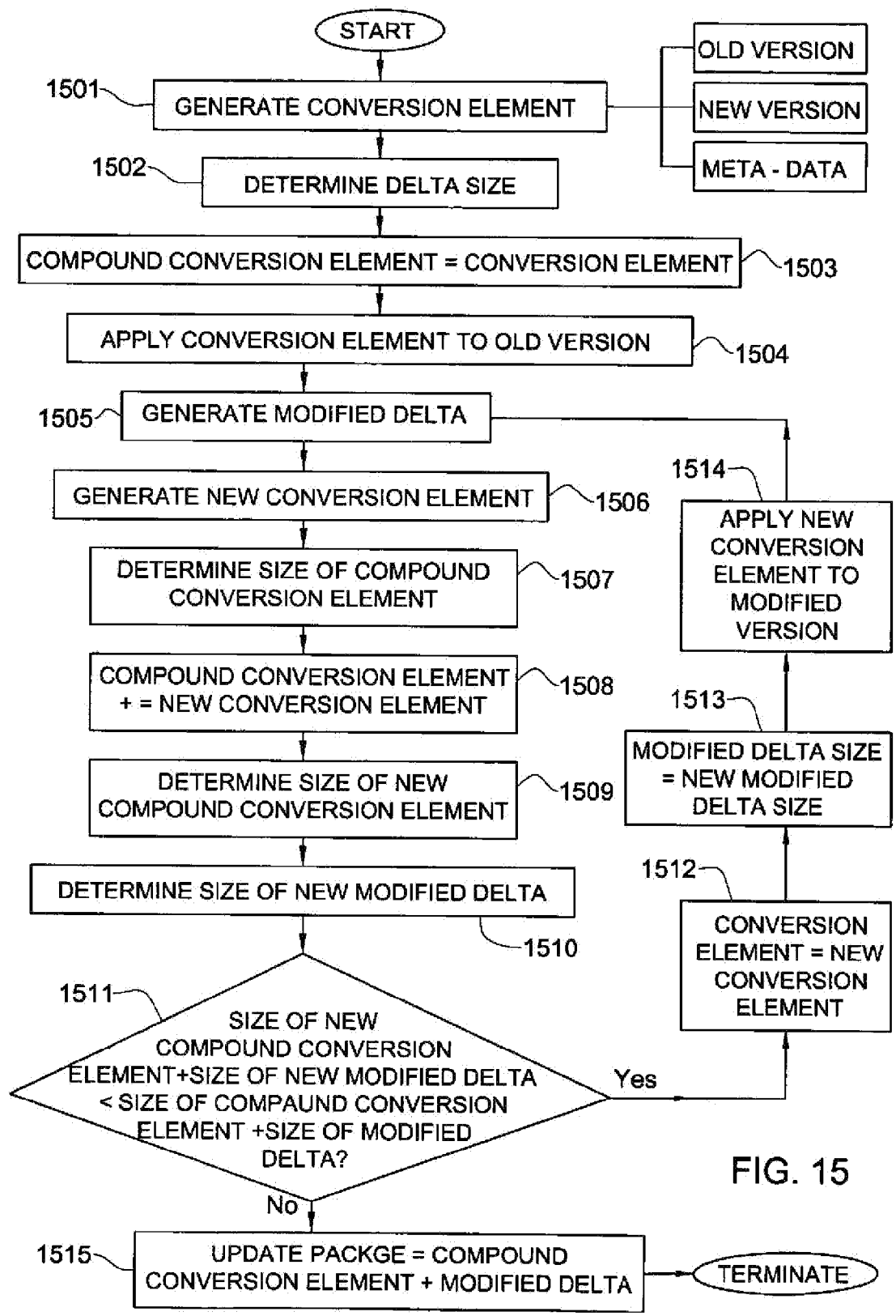
FIG. 15 is a flowchart describing in detail the iterations embodiment of the invention.

FIG. 15 is a flowchart describing in detail the iterations embodiment of the invention. It is noted that the update package generated in accordance with this flowchart is in forward conversion order.

Upon start, the method described receives at least an old and a new version of the content to be updated, and meta-data, if available. The two versions and the meta-data serve as the basis for the generation (1501) of a conversion element and for determining (1502) the initial delta size, wherein it can be appreciated that initially the compound conversion element is identical (1503) to the conversion element generated in 1501. The conversion element is applied (1504) to the old version, generating a modified version thereby. Next a modified delta is generated (1505) while utilizing a modified diff on the modified and new version, and the modified delta serves as a basis for generation (1506) of a new conversion element. The size of this new conversion element is determined (1507).

The new conversion element is merged (1508) into the compound conversion element. The size of the new conversion element is determined (1509) and the size of the modified delta (1510).

If the size of the compound conversion element together with the delta size is smaller than the size of the new conversion element together with the size of the modified delta (1511) the new conversion element becomes the conversion element (1512), the delta size becomes the new delta size (1513) and the new conversion element is applied to the modified version (1514) creating a new modified version thereby. Returning to 1505 a new modified delta is created.

However, if on 1511 it is determined that the size of the conversion element together with the size of the modified delta is equal or larger than the size of the compound conversion element together with the delta size, an update package is generated (1515) on the basis of the compound conversion element and the modified delta. Alternatively, on 1511 the stop criterion is met if the compact update package is larger than the compact update package generated in the previous iteration.

It should be appreciated that the iterations embodiment can operate also in the backward conversion order, that is the complete diff is applied between the old version and the new version for generating an initial conversion element, wherein the modified version is created by applying the conversion element on the new version. Next a modified delta is generated between the old version and the modified version for generating a new conversion element and so on.

An update package is marked to indicate the conversion order in accordance with the update package was generated.

It should be noted that the invention is not bound to the specific sequence of operation and manner of generating the update package as described in FIG. 15.

Having described the generation of an update package in accordance with various non-limiting embodiments of the invention, there follows a description of using the update package for updating an old version giving rise to a new version. By way of non-limiting example the update package is transmitted through a wireless communication medium and received by cellular telephone device. The cellular telephone device includes a processor configured to process the so received updated package and to update an old version of program and/or data stored therein giving rise to a new version that is stored and operable in the cellular telephone device.

Figure 16:
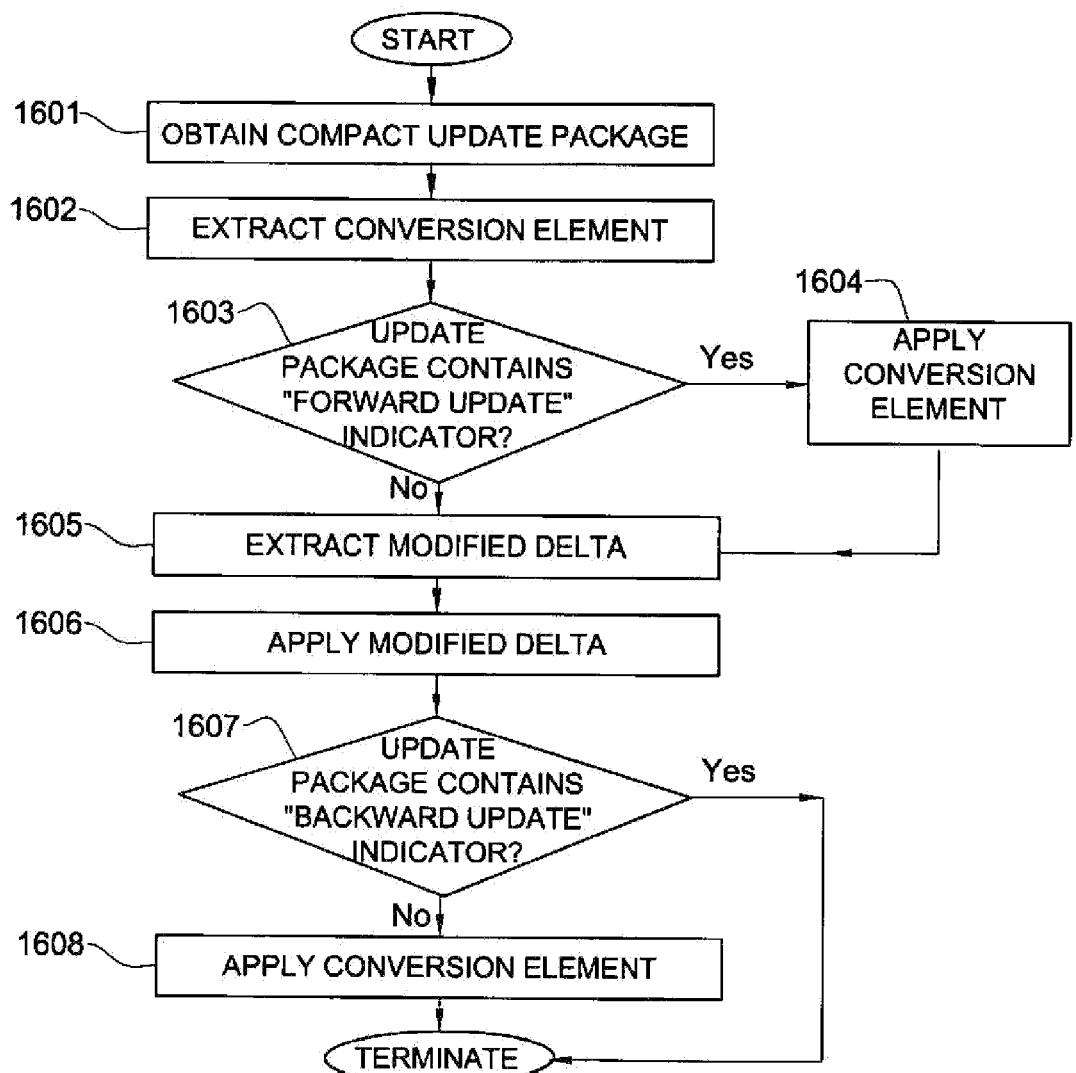
FIG. 16 is a flowchart describing an update of an old version of content giving rise to a new version of content.

Bearing this in mind, attention is drawn to FIG. 16 illustrating a flowchart describing an update of an old version of content giving rise to a new version of content, in accordance with one embodiment of the invention. An update package in accordance with this embodiment includes a conversion element and a modified delta. It should be noted that an update package includes either a forward update indicator or a backward update indicator.

After obtaining a compact update package (1601) the conversion element included therein is extracted (1602).

If the update package includes a forward update indicator, as detected on 1603, the conversion element is applied (1604) to the old version, generating a modified version. Then the modified delta is extracted (1605) from the update package and applied (1606) to the modified version. On the other hand, if it is found on 1603 and 1607 that the update package includes a backward update indicator, the modified delta is first extracted (1605) and applied (1606) to the old version generating a modified version on which the conversion element is then applied (1608). In both cases the result is the new version.

Figure 17:
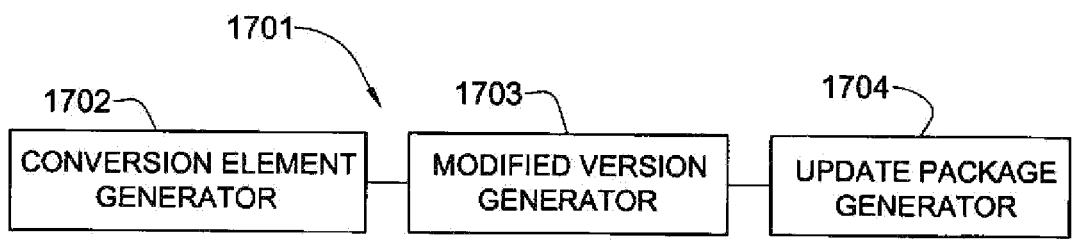
FIG. 17 illustrates a system for generating a compact update package between an old version of content and a new version of content, in accordance with one embodiment of the invention.

FIG. 17 illustrates a system 1701 for generating a compact update package between an old version of content and a new version of content, in accordance with one embodiment of the invention. The system includes a conversion element generator 1702 for generating a conversion element associated with the old version and new version. A modified version generator 1703 for generating a modified version including applying the conversion element to the old versions. An update package generator 1704 for generating the compact update package. The compact update package includes the conversion element and a modified delta based on the modified version and the new version.

Figure 18:
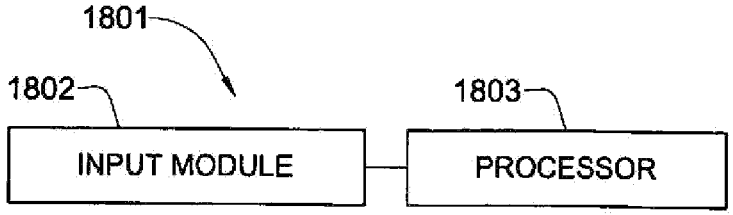
FIG. 18 illustrates a system for updating an old version of content giving rise to a new version of content, in accordance with one embodiment of the invention.

FIG. 18 illustrates a system 1801 for updating an old version of content giving rise to a new version of content, in accordance with one embodiment of the invention. The system includes an input module 1802 and a processor 1803. The input module is configured to obtaining a compact update package that includes a conversion element associated with said old version and new version, a modified delta, and indication of forward update or backward update. In the case of forward update indication the processor is configured to generate the modified version including applying the conversion element to the old version. The processor is also configured to generate the new version including applying the modified delta to the modified version. In the case of backward update indication the processor is configured to generate a modified version including applying the modified delta to the old version. The processor is also configured to generate the new version including applying the conversion element to the modified version.

It will also be understood that the system according to the invention may be a suitably programmed computer. Likewise, the invention contemplates a computer program being readable by a computer for executing the method of the inven- The invention further contemplates a machine-readable memory tangibly embodying a program of instructions executable by the machine for executing the method of the invention.

The present invention has been described with a certain degree of particularity, but those versed in the art will readily appreciate that various alterations and modifications may be carried out, without departing from the scope of the following Claims.

The invention claimed is:

1. A method for generating a compact update package between an old version of content and a new version of content, comprising:
   (i) generating, in a specifically programmed computer, a conversion element associated with said old version of content and new version of content and including one or more shift rules, wherein the one or more shift rules are applied while updating said old version of content to said new version of content;
   (ii) determining to which of said old version and said new version of content the conversion element is to be applied;
   (iii) generating a modified version by applying the conversion element to said determined old or new version of content;
   (iv) if said modified version is generated by applying the conversion element to the determined old version of content, generating a modified delta based on a comparison of at least said modified version and the new version;
   (v) if said modified version is generated by applying the conversion element to the determined new version of content, generating a modified delta based on a comparison of at least said modified version and the old version: and
   (vi) generating, by the specifically programmed computer, a compact update package including the generated conversion element and the generated modified delta.

2. The method according to claim 1, wherein said shift rules comprise a numerical shift rule.

3. The method according to claim 2, wherein said numerical shift rule is an integer shift rule.

4. The method according to claim 1, wherein said shift rules comprise a reference shift rule.

5. The method according to claim 4, wherein said at least one reference shift rule is associated with difference table.

6. The method according to claim 5, wherein said difference table is based on at least meta data associated with the content of said old and new versions of content.

7. The method according to claim 6, wherein said metadata is content description data.

8. The method according to claim 7, wherein said content description data is a member in a group that includes map files, symbol tables, and debug tables.

9. The method according to claim 1, wherein said content includes one of a computer program and content.

10. The method according to claim 1, wherein a series of the following steps is repeatedly applied as iterations until a stop criterion is met, the series of steps including:
   (a) generating a current conversion element associated with the new version of content and with a previous modified version, the previous modified version being either the old version for a first iteration or obtained in a previous iteration;
   (b) generating a current modified version including applying the current conversion element to the previous modified version;
   (c) generating a current modified delta based on a comparison of at least said current modified version and the new version; and
   (d) generating a compact update package including (1) a compound conversion element that includes conversion elements generated in all preceding iterations and (2) the current modified delta, wherein
   (i) if said stop criterion is not met, repeating the series of steps (a)-(d); and
   (ii) if the stop criterion is met, selecting a compact update package of a smallest size from among the compact update packages generated during the series of step (a)-(d) in all iterations.

11. The method according to claim 10, wherein said stop criterion is met if compact update package is larger than compact update package generated in a previous iteration.

12. A computer program product comprising a program of instructions executable by a machine to perform method steps for executing a method according to claim 1.

13. A compact update package stored on a tangible medium comprising a program of instructions executable by a machine obtainable according to the method of claim 1.

14. A method of using a compact update package, stored on a tangible medium comprising a program of instructions executable by a machine, obtainable according to claim 1, said method of use comprising one or more of: storing said compact update package, transmitting said compact update package, and performing an update of an old version of content to a new version of content.

15. The method according to claim 1, wherein a series of the following steps is repeatedly applied as iterations until a stop criterion is met, the series of steps including:
   (a) generating a current conversion element associated with said old version of content and a previous modified version, the previous modified version being either the new version for a first iteration or obtained in a previous iteration;
   (b) generating a current modified version including applying the current conversion element to the previous modified version;
   (c) generating a current modified delta based on a comparison of at least said current modified version and the old version; and
   (d) generating a compact update package including (1) a compound conversion element that includes conversion elements generated in all preceding iterations and (2) the current modified delta; wherein
   (i) if said stop criterion is not met, repeating the series of steps (a)-(c); and
   (ii) if the stop criterion is met, selecting a compact update package of a smallest size from among the compact update packages generated during the series of step (a)-(d) in all iterations.

16. The method according to claim 15, wherein said stop criterion is met if compact update package is larger than compact update package generated in the previous iteration.

17. A method of updating an old version of content to a new version of content, comprising:
   using a compact update package on said old version of content to update it to be said new version of content, wherein said compact update package is generated according to a method comprising:
   (i) generating, in a specifically programmed computer, a conversion element associated with said old version of content and new version of content and including one or more shift rules, wherein the one or more shift rules are applied while updating said old version of content to said new version of content;

(ii) determining to which of said old version and said new version of content the conversion element is to be applied;

(ii) generating a modified version by applying the conversion element to said determined old or new version of content; and (iii) generating, by the specifically programmed computer, said compact update package, based upon said conversion element and a modified delta, wherein if it is determined that said conversion element is to be applied to the old version, said modified delta is based on a comparison of said modified version and the new version, and if it is determined that said conversion element is to be applied to the new version, said modified delta is based on a comparison of said modified version and said old version.

18. A system for generating a compact update package between an old version of content and a new version of content, comprising:

at least one processor;

a memory embedded with computer executable instructions executed by the at least one processor, the computer executable instructions comprising:

a conversion element generator for generating a conversion element associated with said old version and new version and including one or more shift rules, wherein the one or more shift rules are applied while updating said old version to said new version;

a determination unit for determining to which of said old version and said new version of content the conversion element is to be applied;

a modified version generator for generating a modified version by applying the conversion element to said determined old or new version of content; and an update package generator for generating said compact update package, wherein the compact update package includes said conversion element and a modified delta, wherein if it is determined that said conversion element is to be applied to the old version, the modified delta is based on a comparison of said modified version and the new version, and if it is determined that said conversion element is to be applied to the new version, the modified delta is based on a comparison of said modified version and said old version.

* * * * *